United States Patent [19]
Sasaki et al.

[11] Patent Number: 5,273,911
[45] Date of Patent: Dec. 28, 1993

[54] METHOD OF PRODUCING A THIN-FILM SOLAR CELL

[75] Inventors: Hajime Sasaki; Hiroaki Morikawa; Kazuhiko Satoh; Mikio Deguchi, all of Itami, Japan

[73] Assignee: Mitsubishi Denki Kabushiki Kaisha, Tokyo, Japan

[21] Appl. No.: 846,793

[22] Filed: Mar. 5, 1992

[30] Foreign Application Priority Data

| Mar. 7, 1991 | [JP] | Japan | 3-69108 |
| May 10, 1991 | [JP] | Japan | 3-135840 |
| May 22, 1991 | [JP] | Japan | 3-149965 |
| Dec. 26, 1991 | [JP] | Japan | 3-359749 |
| Feb. 7, 1992 | [JP] | Japan | 4-56745 |

[51] Int. Cl.$^5$ .............. H01L 31/18; H01L 31/0392; H01L 31/0368
[52] U.S. Cl. ................ 437/4; 136/258; 136/244; 437/82; 437/109; 437/174; 437/233; 437/247; 437/967; 148/DIG. 122; 427/74
[58] Field of Search ............ 437/2-; 148/DIG.; 136/258; 407/74

[56] References Cited

U.S. PATENT DOCUMENTS

| 3,961,997 | 6/1976 | Chu | 437/4 |
| 4,077,818 | 3/1978 | Chu | 437/2 |
| 4,113,532 | 9/1978 | Authier et al. | 437/4 |
| 5,017,243 | 5/1991 | Otsubo | 136/244 |

FOREIGN PATENT DOCUMENTS

| 3322685 | 6/1983 | Fed. Rep. of Germany | 136/258 PC |
| 3727826 | 8/1987 | Fed. Rep. of Germany | 136/244 |
| 53-44192 | 7/1978 | Japan . | |
| 59-3980 | 1/1984 | Japan | 136/244 |
| 59-16386 | 1/1984 | Japan | 136/255 |
| 60-194355 | 12/1985 | Japan | 136/244 |
| 61-54681 | 3/1986 | Japan | 136/244 |
| 62-143897 | 6/1987 | Japan . | |
| 2-72677 | 3/1990 | Japan . | |
| 3-22574 | 1/1991 | Japan | 136/251 |

OTHER PUBLICATIONS

M. Kerber et al, *Conference Record, 17th IEEE Photoltaic Specialists Conference* (1984), pp. 275-280 (Oct. 1984).

T. L. Chu, Silicon Films on Foreign Substrates for Solar Cells, Journal of Crystal Growth 39 (1977), pp. 45-60.

T. L. Chu, Polycrystalline Silicon Layers for Solar Cells, J. Vac Sci. Technol., vol. 12, No. 4, Jul./Aug. 1975, pp. 912-915.

Graef et al, "Enhanced Crystallinity Of Silicon Films Deposited By CVD On Liquid Layers (CVDOLL Process): Silicon On Tin Layers In The Presence Of Hydrogen Chloride", *Journal of Applied Physics*, vol. 48, No. 9, Sep. 1977, pp. 3937-3940.

Chu et al, "Deposition And Properties Of Silicon On Graphite Substrates", *Journal of the Electrochemical Society*, vol. 23, Jan. 1976, pp. 106-110.

Kazmerski, "An Overview Of Thin-Film Polycrystalline Silicon Research And Development", *14th IEEE Photovoltaic Specialists Conference*, 1980, pp. 281-286.

*Primary Examiner*—Aaron Weisstuch
*Attorney, Agent, or Firm*—Leydig, Voit & Mayer

[57] ABSTRACT

A method for producing a thin-film solar cell having a thin-film active layer on a graphite sheet substrate includes the steps of adhering two sheets of graphite together, forming semi-conductor thin films serving as active layers on second main surfaces of the two sheets of graphite, and separating the two sheets of graphite from each other. In this structure, stress caused by a difference in expansion coefficients between the upper sheet and the semiconductor thin film is cancelled by stress caused by a difference in expansion coefficients between the lower sheet and the semiconductor thin film. Therefore, curvature of the substrates is prevented wl.ereby subsequent process steps are easily carried out. In addition, the number of products per unit time is doubled, thereby increasing productivity.

8 Claims, 32 Drawing Sheets

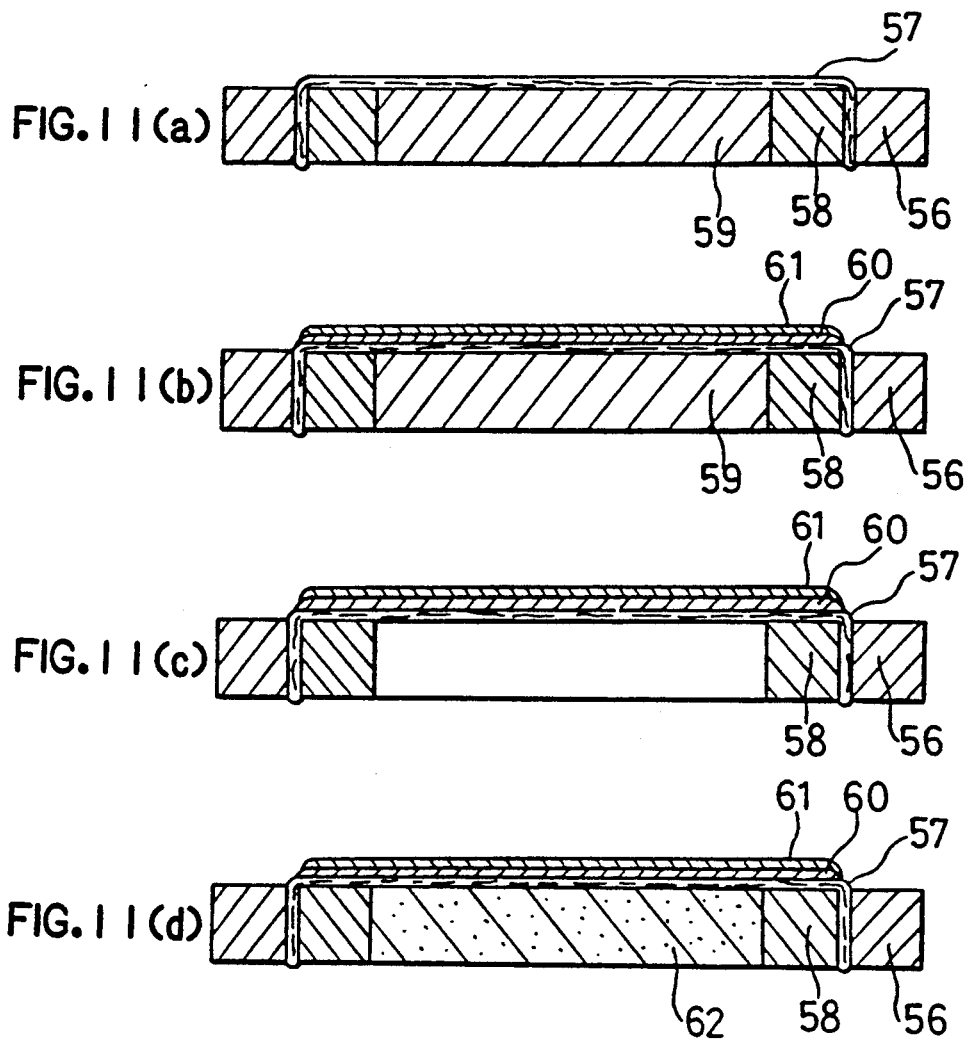
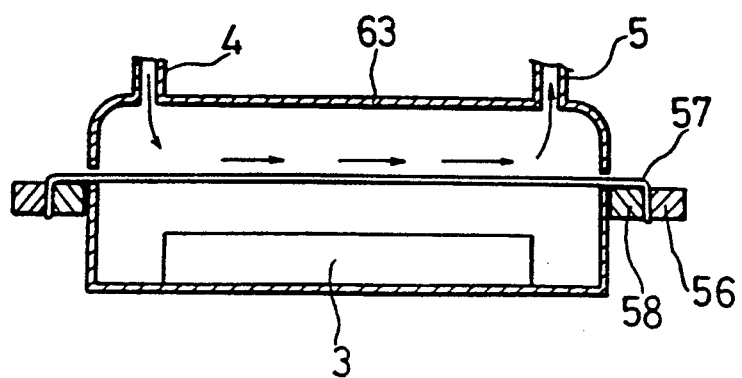

F I G. 15
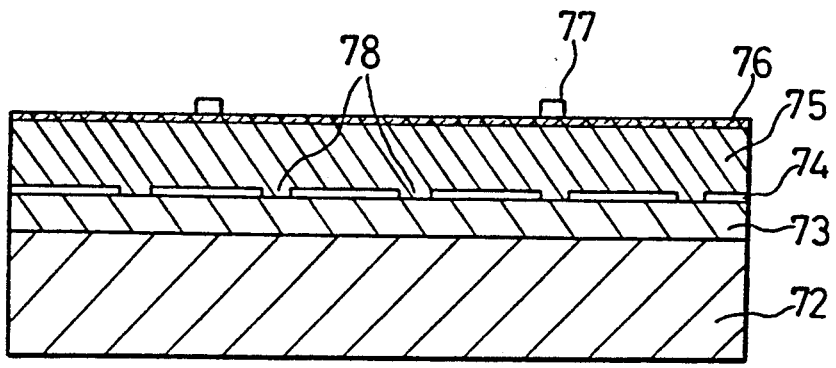
F I G. 16
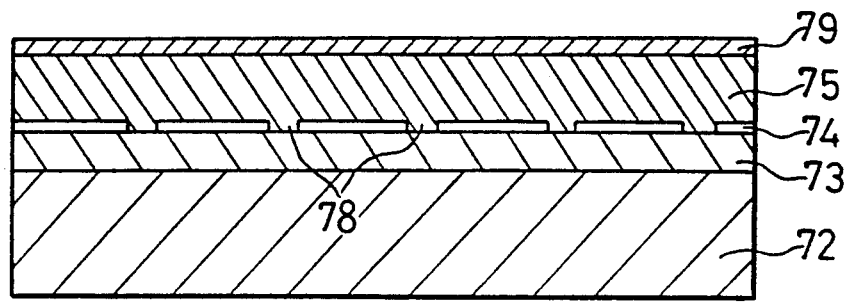

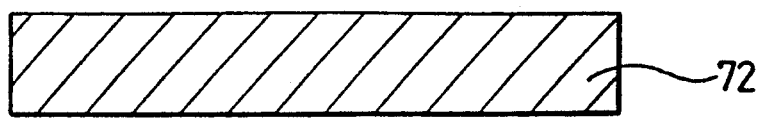
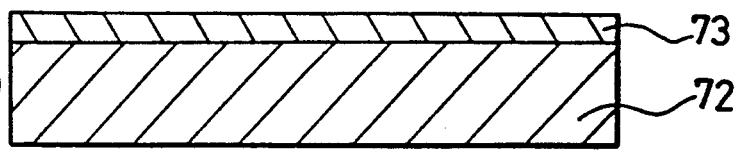
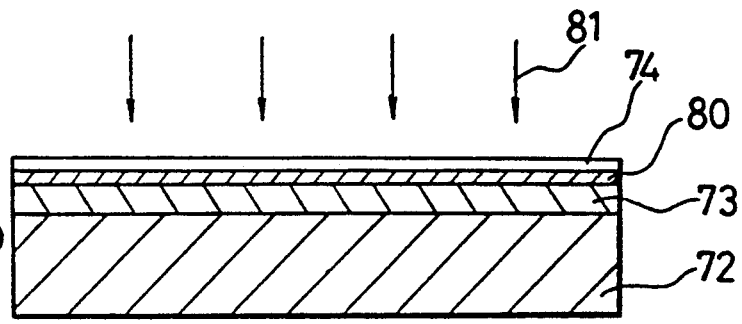
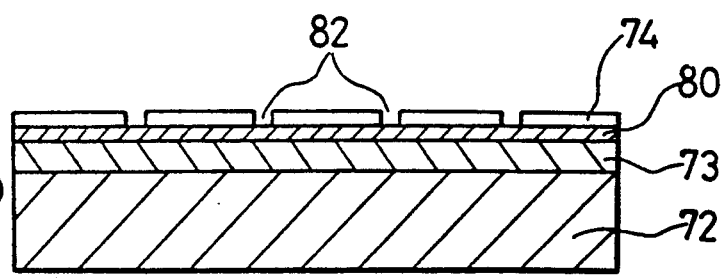
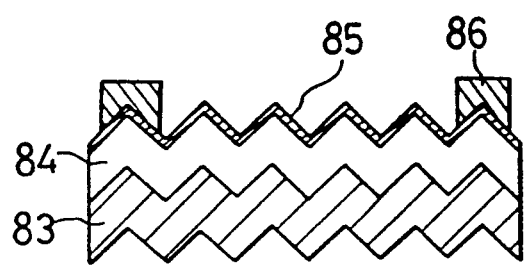

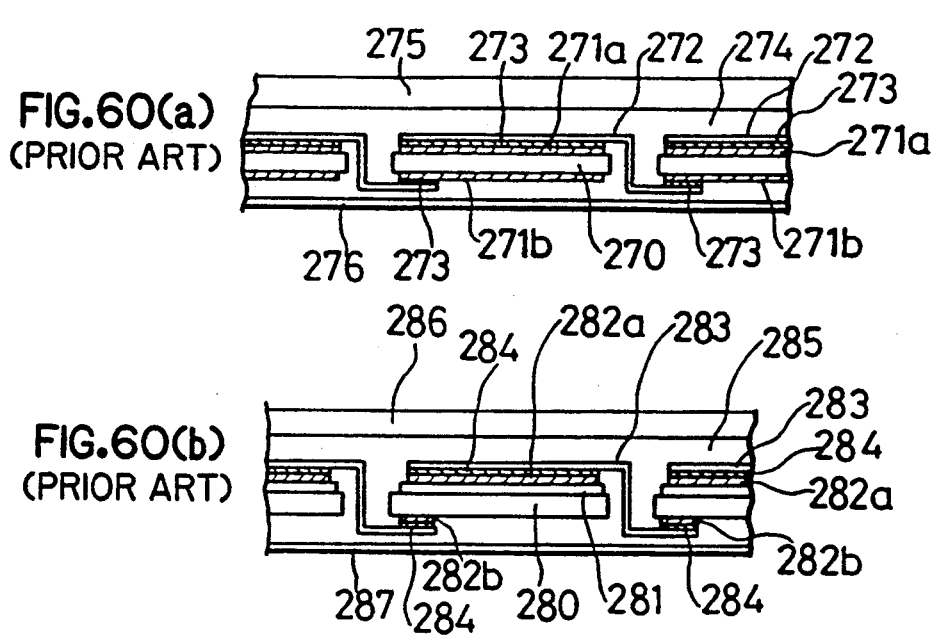
FIG.60(a) (PRIOR ART)
FIG.60(b) (PRIOR ART)
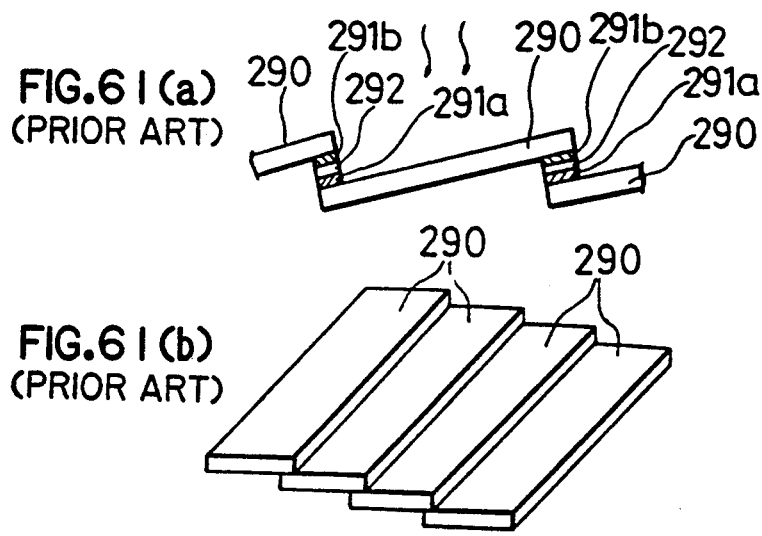
FIG.61(a) (PRIOR ART)
FIG.61(b) (PRIOR ART)
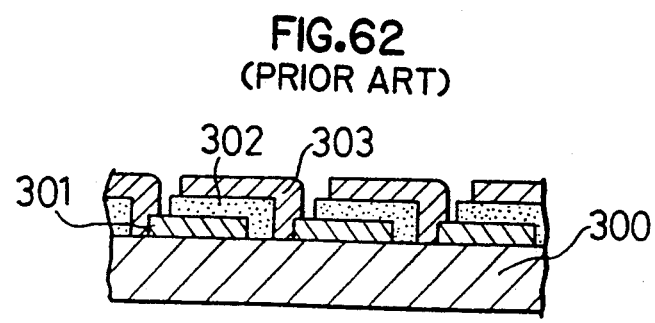
FIG.62 (PRIOR ART)

METHOD OF PRODUCING A THIN-FILM SOLAR CELL

FIELD OF THE INVENTION

The present invention relates to thin film solar cells and methods of producing the solar cells. More particularly, the invention relates to thin film solar cells utilizing graphite sheets or the like as substrates and production methods that simplify production processing, improve the performance and reliability of solar cells so produced, and reduce production costs.

BACKGROUND OF THE INVENTION

FIG. 43 is a perspective view of a thin film solar cell including a thin silicon film on a substrate. In FIG. 43, a substrate 200 supports an active layer 201 including a p-n junction for power generation. An anti-reflection film 202 is disposed on the active layer 201 and an upper electrode is disposed on the anti-reflection film 202. The upper electrode comprises a grid electrode 203a for collecting photoelectric current generated in the active lawyer 201 and a bus electrode 203b concentrating the current from the grid electrode 203a. A lower electrode 204 is disposed on the rear surface of the substrate 200.

In this film solar cell, the active layer 201 is only several tens of microns thick and, therefore, cannot support itself so that some supporting substrate is required. The substrate must be able to support the thin film and itself. Since the silicon active layer is grown on the substrate 200 by thermal chemical vapor deposition (CVD) or the like, the substrate must be refractory so that it can stand a processing temperature of approximately 1,000° C. Since the substrate also is an electrode, it should be electrically conductive. If the substrate is not electrically conductive, it is necessary to contact the lower electrode by disposing an electrically conductive film on the substrate or by producing an integrated solar cell, resulting in a complicated structure. Since the substrate itself does not contribute to power generation but only supports the active layer, the substrate should be inexpensive.

Substrates comprising steel, graphite, metallurgical grade silicon, or the like meet the above-described requirements to some extent, as discussed in 14th IEEE Photovoltaic Specialists Conference, (PVSC14), page 281 (1980), by L. L. Kazmerski. A steel substrate or metallurgical grade silicon substrate includes a large quantity of impurities, such as Fe, that adversely affect the solar cell characteristics even when present in a very small amount. Therefore, these materials are not suitable for a thin film solar cell substrate. Kazmerski describes the graphite substrate as the most suitable of the substrate that satisfy the foregoing requirements.

FIG. 44 is a cross-sectional view showing a prior art thin film solar cell having a graphite substrate, disclosed in the Journal of the Electrochemical Society, 123, page 106 (1976) by Chu et al. This thin film solar cell has the same structure as that shown in FIG. 43 and FIG. 44 corresponds to part of a cross-section taken along line 44—44 of FIG. 43. In FIG. 44, a conductive substrate 205 comprises sintered graphite supporting a polycrystalline silicon thin film active layer 206. An anti-reflection film 207 is disposed on the active layer 206. An upper electrode 208 is disposed on the anti-reflection film 207 and a lower electrode 209 is disposed on the rear surface of the substrate 205.

The graphite substrate is formed from graphite powder obtained from anthracite, coke, or the like placed in a mold and sintered at a temperature of about 3,000° C. Then, the graphite is removed from the mold and polished to make its surface flat, completing the graphite substrate.

The thus-formed graphite substrate is placed in a CVD apparatus and silane ($SiH_4$) or silane trichloride ($SiHCl_3$) is introduced into the apparatus and reacted at a temperature of about 1,000° C. whereby a polycrystalline silicon film (active layer 206) having a thickness of several tens of microns is grown on the graphite substrate 205. The grown thin silicon film has small diameter crystal grains so that, in some cases, the polycrystalline silicon is melted and recrystallized by laser radiation or lamp heating to increase the diameters of the crystal grains. After forming the film, a p-n junction is produced in the active layer 206 by impurity diffusion or ion implantation. The p-n junction may be produced by changing the dopant gas while the active layer is formed using dopant source gases in the CVD process or by depositing, in a plasma CVD process, a microcrystalline film having a conductivity type opposite that of the active layer.

After forming the p-n junction, the anti-reflection film 207 is formed by sputtering or the like. As the anti-reflection film 207, a transparent conductive film also serving as an electrode, such as an ITO ($In_2O_3$:$SnO_2$) film, an $SnO_2$ film, or a ZnO film, is used when the conductivity of the silicon film in the transverse direction is low. When the conductivity of the silicon film in the transverse direction is high and the transparent electrode is not required, an insulating film, such as a $Si_3N_4$ film, is used as the anti-reflection film. Thereafter, an upper electrode 208 is formed on the anti-reflection film 207. The upper electrode usually comprises silver and it is formed by screen printing or vapor deposition.

The thin film solar cell having the graphite substrate has the following drawbacks.

The graphite substrate is formed in a complicated process requiring manual labor. Graphite powder is placed in a mold and sintered at a temperature of 2,000°–3,000° C. Then, the graphite is removed from the mold and polished to make the surface flat. Therefore, although the graphite powder is inexpensive, the production cost is high because a high temperature process is required. In addition, since the graphite must be placed in the mold and then removed from the mold, continuous production is difficult.

Even if the surface of the graphite substrate is polished, an unevenness of several microns remains, causing electrical leakage, especially when the active layer is thin. FIG. 45 is an enlarged view of a surface portion of the conventional graphite substrate (in FIG. 44, the surface of the substrate 205 in contact with the active layer 206). Reference numeral 201 designates graphite powder. As shown in FIG. 45, the conventional graphite substrate has an unevenness of several microns.

Since the conventional graphite substrate has a low reflectivity, light passing through the active layer is hardly reflected by the surface of the substrate. As a result, it is not possible to effectively utilize the incident solar light.

Since the conventional graphite substrate is porous, it absorbs water from the rear surface when used for a long time, resulting in a deterioration in the active layer.

Since the graphite substrate is not pliable, continuous production utilizing the roll-to-roll method shown in FIG. 33(a) is impossible. In the conventional method, graphite substrates are placed on a susceptor one-by-one and the thin film solar cells are produced one-by-one, resulting in difficulty in continuous mass production.

On the other hand, when the active layer is an amorphous film that can be formed at a temperature lower than 300° C., continuous production can be carried out utilizing a sheet of heat-resistant plastic. However, since the heat resistance temperature of the substrate is approximately 300° C., the conditions for film formation are restricted. In addition, since the substrate has poor moisture resistance, it easily absorbs water.

FIG. 46 shows a method for producing the thin film solar cell disclosed in Japanese Published Patent Application 53-44192. In FIG. 46, a graphite sheet substrate 211 is moved by rollers 212 and 213 through an apparatus including an active layer formation chamber 214, a grain diameter enlargement chamber 215, and a p-n junction formation chamber 216. Source gases for forming the active layer are introduced into the active layer formation chamber 214 through a gas inlet 217. Power sources 219 generating current conducted through terminals 200 are connected to the graphite sheet substrate 211 for heating the substrate. A lamp 221 heats and a cutter 222 cuts the substrate.

The graphite sheet substrate 211 is fed to the active layer formation chamber 214 by the roller 212. A source gas, such as silane or dichlorosilane, for forming the silicon thin film active layer is introduced into the active layer formation chamber 214&through the gas inlet 217. Since the graphite sheet substrate 211 is in contact with the terminals 220, current supplied from the power source 219 flows in and heats the substrate. When the substrate is heated, the source gas reacts and a polycrystalline silicon active layer is deposited on the substrate 211. The reacted gas and unreacted gas are discharged through the gas outlet 218.

The graphite sheet substrate on which the polycrystalline silicon thin film is formed is transferred to the grain diameter enlargement chamber 215 by the roller. In the grain diameter enlargement chamber 215, the substrate is heated by current supplied from the power source 219 and the polycrystalline silicon thin film is heated by the lamp 221 whereby the polycrystalline silicon is melted and recrystallized to increase the grain diameters of the silicon.

In the p-n junction formation chamber 216, a p-n junction is formed in the silicon thin film by impurity diffusion or the like. Thereafter, the substrate 211 is cut in a prescribed length by the cutter 222.

In this prior art structure, a graphite sheet satisfies the above-described requirements, specifically, support of a thin film, refractory behavior, electrical conductivity, and low cost. Sheet graphite has conventionally been used as a refractory gasket or packing, a heat insulating material of a nuclear reactor, or the like.

FIG. 47 shows the crystal structure of sheet graphite. Sheet graphite is made from naturally-occurring flaky graphite and has a crystal structure in which layers 223, having carbon atoms arranged in a plane with six carbon atoms (circles) connected with each other, are laminated. Although the bonds between the carbon atoms in the same plane are strong, bonds between the carbon atoms in different layers 223 are weak because they are van der Waals bonds, so that the graphite easily cleaves into layers. Although the crystal structure of the flaky graphite is similar to that of conventional graphite powder when seen microscopically, the crystal size of the flaky graphite is larger than that of graphite powder and there are cases where crystals are as large as several millimeters.

FIG. 48 shows a method for producing the sheet graphite. Flaky graphite is given an acid treatment in a solution comprising $NH_4OH$ and $H_2SO_4$ and then the acid is evaporated at 300° C. whereby the flaky graphite foams and becomes like cotton, increasing its volume. Foamed graphite 224 is pressed by rollers 225 at room temperature, resulting in a graphite sheet 226. The graphite sheet is formed by applying pressure without high temperature treatment because each of the crystals is relatively large.

Since the graphite sheet is formed by rolling, the crystal structure and the layer structure are laminated in a thickness direction of the substrate. Such an anisotropic structure may be formed by applying pressure from one direction. Since the internal structure of the graphite sheet is anisotropic, its thermal and electrical conductivity are anisotropic in the surface direction and the thickness direction. In addition, the graphite sheet formed at room temperature is flexible and its surface is always smooth.

When the graphite sheet is formed by rolling, the surface configuration of the substrate depends on the surface configuration of the rollers. Therefore, to produce a smooth surface of the substrate, the rollers have smooth surfaces.

FIG. 49 is an enlarged view of a surface portion of the graphite sheet. As shown in FIG. 49, the graphite sheet has a structure in which layers 227, each having one or a plurality of the crystal structures shown in FIG. 47, are laminated. Accordingly, although the flexibility of the substrate causes a waviness of several millimeters to several centimeters, there is little unevenness of the surface so long as it is not damaged physically and the surface is fundamentally very smooth.

Furthermore, since the layers 227 run parallel to the surface of the graphite substrate, the side surfaces of the substrate easily absorb water and air, but water and air hardly percolate in a direction perpendicular to the surface of the substrate. Therefore, even when water is applied to the rear surface of the substrate, water does not affect the active layer.

Since the layers 227 run parallel to the surface of the graphite substrate, the reflectivity of the graphite substrate is higher than that of an ordinary isotropic graphite plate. The reflectivity in the direction perpendicular to the planar crystal structure of the graphite is higher than the reflectivity in the parallel direction.

In the production method illustrated in FIG. 46, a graphite sheet having the above-described characteristics is used as a substrate whereby thin film solar cells with high efficiency and high reliability are produced continuously.

However, the production method shown in FIG. 46 has the following drawbacks. The active layer is formed by lamp heating or electric heating. With lamp heating, since the entire reaction chamber is heated, polycrystalline silicon is deposited on the internal wall of the chamber so that chamber maintenance takes a long time. In addition, since the graphite sheet has a lustrous surface, its reflectivity is large compared to an ordinary sintered carbon plate. Therefore, the heating light is also reflected from the surface so that the heating is not carried out effectively. With electrical heating, the terminals of the power source may not be well connected to the graphite sheet or the temperature of the substrate may be uneven because the current flows unevenly. In addition, since the graphite sheet is very soft, the graphite sheet may be deformed or exfoliate at the connecting portions 228 of the graphite sheet 221 and the terminals 220, as shown in FIG. 50.

Since the graphite sheet substrate is soft and flexible, when a thin film of polycrystalline silicon is formed on the substrate by CVD, the substrate curves, as shown in FIG. 53, due to the difference of thermal expansion coefficients between the silicon 237 and the graphite 236, adversely affecting the following process. When the grain diameter enlargement step is carried out, heat is not evenly applied to the crystalline surface so that the grain diameters are enlarged in only part of the substrate. As a result, the enlargement of grain diameters over the entire substrate is only possible when a very small substrate, about several centimeters square, is used. This problem occurs not only when solar cells are continuously produced using the beltlike graphite sheet, as shown in FIG. 46, but also when solar cells are produced one-by-one using graphite sheets.

In a conventional process for forming a thin film, not limited to the method of FIG. 46, source gases introduced into a reaction chamber are exhausted through an outlet before they are completely reacted, which means that the source gases are not effectively used. This loss mitigates an important advantage of a thin film solar cell, that is, a reduction in production cost by decreasing the quantity of semiconductor gases used in the production process.

Because the thin film formation chamber 214 into which the source gases are introduced is large and much maintenance of the chamber 214 is required, production costs are high.

When the grain diameters of the thin film polycrystalline silicon on the graphite sheet substrate are increased by zone melting, in FIG. 46, the polycrystalline silicon condenses due to the curvature or the like of the substrate. Further, the grain diameter enlargement chamber 215 is contaminated with silicon evaporated from the surface of the polycrystalline silicon layer.

A thin film solar cell utilizing a metallurgical grade silicon (hereinafter referred to as MG-Si) substrate 350 is shown in FIG. 54. In FIG. 54, a silicon thin film 351 is disposed on the MG-Si substrate 350. An emitter layer 352 is formed in the surface region of the thin film 351 by impurity diffusion or the like. An upper grid electrode 353 is disposed on the emitter layer 352. The MG-Si substrate is less expensive than crystalline silicon having high purity and never curves when a thin film polycrystalline silicon layer is formed on it. However, the MG-Si substrate is heated to about 1,000° C. when the polycrystalline silicon layer is grown and up to the melting point of silicon (1,414° C.) when the grain diameter is enlarged. Therefore, as shown in FIG. 55, impurities 354, such as Fe, Al, or Ca, in an amount of approximately 2% in the MG-Si substrate 350 diffuse from the surface whereby the active layer is degraded.

FIG. 51 is a cross-sectional view schematically showing a prior art solar cell utilizing a crystalline silicon thin film on a substrate mainly comprising carbon. In FIG. 51, a substrate 230 whose main component is carbon has a silicon layer 231 disposed on it. An emitter layer 232 is disposed on the silicon layer 231 and a metal electrode 233 is disposed on the emitter layer 232.

Since the substrate 230 mainly comprises carbon, molded carbon, or graphite, a graphite sheet or the like may be used as the substrate 230. The substrate 230, mainly comprising carbon, has the following advantages. Since carbon withstands a temperature of about 3,000° C. in a reactive atmosphere, can withstand the temperature of 1,000°-1,500° C., required for forming a crystalline silicon thin film. Because carbon has good electrical conductivity, it can also serve as a rear electrode of the solar cell. Since carbon is found in abundance on the earth, it is good for mass production. Since carbon atoms form strong chemical bonds with silicon atoms, carbon has sufficient adhesion as a supporting substrate of the silicon film.

A p-type silicon layer 231 is deposited on the substrate 230 by CVD or the like. The silicon layer formed by CVO becomes polycrystalline silicon when the temperature exceeds 600° C., but the grain diameters of the polycrystalline silicon thus obtained are not larger than one micron. In order to obtain improved performance of a solar cell, the polycrystalline silicon is melted and then recrystallized on the substrate 230 to increase the grain diameters. In this way, a silicon layer 231 in which the diameters of the crystal grains are twice as large as their thicknesses is obtained.

An n-type emitter layer is formed in the surface region cf the silicon layer 231 by impurity diffusion or other means to form a p-n junction. Thereafter, a transparent conductive film, an anti-reflection film, or the like (not shown) is formed as occasion demands. Finally, a metal electrode 233 is formed to complete the solar cell.

In the solar cell shown in FIG. 51, since the silicon layer 231 is directly formed on the substrate 230 mainly comprising carbon, a small amount of impurities included in the substrate 230, such as calcium, iron, aluminum, or sulfur, is diffused into the silicon layer 231 while forming the silicon layer 231 or the emitter layer 232 at a high temperature. These impurities degrade the characteristics of the silicon layer 231 as a semiconductor, resulting in poor performance of the solar cell.

In order to solve this problem, the structure shown in FIG. 52 has been proposed. In this structure, a silicon oxide film 234 is inserted between the substrate 230 and the silicon layer 231. When the entire surface of the substrate is covered with the silicon oxide film 234, the silicon layer 231 and the substrate 230 are electrically isolated from each other. Apertures 235 are formed through prescribed portions of the silicon oxide film 234 to electrically connect the substrate 230 with the silicon layer 231.

In this case, although the silicon oxide film 234 serves as a barrier, blocking the impurities from the substrate 230, the impurities are diffused into the silicon layer 231 through the apertures 235, as in the structure shown in FIG. 51. Further, since adhesion between carbon and the silicon oxide film 234 is weak because of the silicon oxide film 234 disposed on the substrate 230, the silicon layer 231 easily exfoliates from the substrate 230 and the structure is easily destroyed, resulting in low reliability and poor production yield.

The reason why the adhesion between carbon and the silicon oxide film 234 is weak will now be described. Carbon reacts with the silicon oxide film at a high temperature and evaporates as carbon dioxide. While forming the silicon layer 231 or the emitter layer 232 at the high temperature, carbon reacts as described above at the boundary between the substrate 230 and the silicon oxide film 234 whereby the chemical bond formed between the substrate 230 and the silicon oxide film 234 is weakened. As a result, only weak adhesion, depending on physical bonding between them, is obtained. Since a chemical bond is formed between the silicon and silicon oxide, adhesion between them is far stronger than the adhesion between the carbon substrate and the silicon oxide film.

When the silicon oxide film 234 is present on the rear surface of the silicon layer 231, light, which is incident on the solar cell and travels through the silicon layer 231 without being absorbed, is reflected and returns into the silicon layer 231 due to a difference of refractive indices between the silicon layer 231 and the silicon oxide film 234. The effect of reflection at the rear surface of the silicon layer 231 is larger when the silicon oxide film 234 is present than, as in the case of FIG. 51, where the silicon layer 231 is directly in contact with the substrate 230.

As described above, the reflection at the boundary between the silicon layer 231 and the silicon oxide film 234 is improved by inserting the silicon oxide film 234. However, the substrate 230 comprising mainly carbon is present beneath the silicon oxide film 234 and absorbs light well because it is black. Therefore, the light passing through the silicon oxide film 234 is not reflected at the boundary between the silicon oxide film 234 and the substrate 230 and the reflection at the rear surface of the silicon layer 231 is not much improved.

In order to complete the structure of the solar cell shown in FIG. 52, the apertures 235 penetrating through the silicon oxide film 234 are required. In conventional patterning of a silicon oxide film, the silicon oxide film is covered with a resist film having a prescribed pattern and etched by dry or wet etching. Since a resist film is used, a wet process is necessary even when using dry etching.

However, the substrate 230, comprising mainly carbon, is porous and absorbs water. Therefore, once the substrate 230 has passed through a wet process, it is difficult to remove water absorbed into the substrate 230. Such a substrate adversely affects laser processes and reduces the reliability of he solar cell.

FIGS. 56 to 58 are cross-sectional views showing conventional solar cells having concavo-convex structures. FIG. 56 shows a monocrystalline solar cell, FIG. 57 shows an amorphous silicon solar cell, and FIG. 58 shows a thin film solar cell.

In the monocrystalline solar cell shown in FIG. 56, a concavo-convex configuration is formed by anisotropic etching using potassium hydroxide (KOH) or the like on the surface of a silicon (100)-oriented monocrystalline wafer 240. Impurities are diffused into the wafer from the surface to form a p-n junction 241. Then, a grid electrode 242 is formed. In order to improve the efficiency of the solar cell, an anti-reflection film (not shown) may be formed on the wafer having the concavo-convex configuration or a back surface field (not shown) may be formed on the rear surface of the wafer by diffusing impurities. In this solar cell, light 243 incident on the concavo-convex part of the wafer is converted into electricity in the monocrystalline layer 240 and then output from the grid electrode 242 and a rear electrode (not shown) on the rear surface of the monocrystalline layer 240. In this structure, light reflected at the wafer surface also enters into the wafer, as shown by arrow 244, due to the concavo-convex configuration of the wafer surface so that less of the incident light is reflected away from the surface, thereby improving light-to-electricity conversion efficiency.

In the amorphous silicon solar cell of FIG. 57, a transparent electrode 246 is formed on a glass substrate 245. The transparent electrode 246 is formed by sputtering, vapor deposition, chemical vapor deposition, or plating $SnO_2$, ZnO, ITO ($In_2O_3$: $SnO_2$), or the like and the concavo-convex configuration is formed by selecting the formation conditions. Then an amorphous silicon film 247 is formed on the transparent electrode 246 by plasma CVD or the like. Further, a rear electrode 248 comprising, for example, Al or Ti/Ag is formed on the amorphous silicon film 247. In the solar cell thus formed, light is incident on the glass substrate 245 and electricity is output from the transparent electrode 246 and the rear electrode 248. In this structure, the angle of the incident light is varied by the concavo-convex part of the transparent electrode 246 so that the light travels a longer distance in the active layer 247 and a larger quantity of the light is absorbed, thereby increasing the light-to-electricity conversion efficiency of the solar cell.

In the thin film solar cell of FIG. 58, a heat-resistant substrate 250 comprising alumina, a conductive ceramic, or the like is mechanically shaped to form a concavo-convex configuration. Then, a polycrystalline silicon thin film 251 is formed on the substrate 150 and impurities are diffused into the polycrystalline silicon thin film 251 to form a p-n junction 252. Thereafter, a grid electrode 253 is formed. In the thin film solar cell thus formed, since the wafer surface has the concavo-convex configuration like the solar cell shown in FIG. 56, less incident light is reflected at the surface, i.e., a larger quantity of light is absorbed. Further, when the light is reflected at the boundary between the active layer and the substrate 250, the angle of the reflection varies so that the light travels a longer distance in the active layer, increasing the light-to-electricity conversion efficiency of the solar cell.

In the solar cell using the crystalline silicon wafer shown in FIG. 56, the concavo-convex configuration is easily formed by chemical treatment. In the amorphous solar cell shown in FIG. 57, the concavo-convex configuration is formed only by changing the conditions for forming the transparent electrode. However, these methods cannot be applied to the thin film solar cell shown in FIG. 58 in which the active layer is formed by heating polycrystalline silicon or the like to a high temperature. In FIG. 58, the concavo-convex configuration is formed by mechanically cutting the heat-resistant substrate or by processing the substrate with a laser or the like, resulting in a complicated and costly production process.

FIGS. 59(a) to 59(f) are perspective views showing process steps for producing the conventional thin film solar cell disclosed in, for example, *Solar Cells*, 29 (1990), pages 257–266. This thin film solar cell is finally separated from a substrate. In the figures, reference numeral 260 designates a p-type monocrystalline silicon substrate. V-shaped stripe grooves 261 are formed on the surface of the substrate 260. An n-type crystal silicon layer 262 is disposed on the substrate 260. V-shaped stripe grooves 263 are formed on the surface of the n-type crystal silicon layer 262. A glass substrate 264 is bonded to the crystal silicon layer 262.

A p-type polycrystalline silicon substrate 260 shown in FIG. 59(a) is first prepared Then, as shown in FIG. 59(b), a plurality of V-shaped stripe grooves 261 are formed in the substrate 260 by anisotropic etching. As shown in FIG. 59(c), a low impurity concentration n-type silicon layer 262 is epitaxially grown on the substrate 260 having the stripe grooves 261. The surface of the silicon layer 262 is flattened by polishing when necessary. Then, as shown in FIG. 59(d), a plurality of V-shaped stripe grooves 263 perpendicular to the stripe grooves 261 are formed on the surface of the silicon layer 262 by anisotropic etching. Thereafter, a p-n junction is formed in the surface region of the silicon layer 262 and a protection film and an electrode (not shown) are formed on the silicon layer 262. Then, as shown in FIG. 59(e), a glass substrate 264 is bonded to the silicon layer 262. The glass substrate and an adhesive agent for the bonding should have properties so as not be etched away in the next etching step. Then, the monocrystalline silicon substrate 260 is removed by selective etching, as shown in FIG. 59(f). A protection film and an electrode (not shown) are formed on the rear surface of the silicon layer 262 to complete a solar cell. This method is not suitable for mass production because the solar cells are produced one-by-one.

FIG. 60(a) is a cross-sectional view showing a conventional solar cell module disclosed in Japanese Published Utility Model Application 60-194355. In FIG. 60(a), a solar cell base 270 comprises monocrystalline or polycrystalline silicon. The solar cell includes an upper metal electrode 271a for collecting current generated by light and a lower metal electrode 271b serving as a counter electrode. A lead wire 272 is connected to the upper electrode 271a of a solar cell and to the lower electrode 271b of another solar cell by solder 273 or the like. A plurality of solar cells thus connected are sealed by a resin 274 between an upper glass sheet 275 and a rear plate 276.

FIG. 60(b) is a cross-sectional view showing a conventional thin film solar cell module disposed on a conductive substrate 280. A power-generating layer 281 comprising a semiconductor thin film is disposed on the substrate 280. An upper metal electrode 282a is disposed on the power-generating layer 281. A lower electrode 282b is disposed on the rear wire 283 is connected to the upper electrode 282a of a solar cell while the other end is connected to the lower electrode 282b of another solar cell by solder 284 or the like whereby the two solar cells are electrically connected. A plurality of solar cells thus connected are sealed by a resin 285 between an upper glass sheet 286 and a rear plate 287.

When light enters into the solar cell 270, electrons and holes are generated in the solar cell. The electrons and holes are transported to the upper side (surface side) and the lower side (rear surface side), respectively, by an internal electrical field in the solar cell and then collected by the upper electrode 271a and the lower electrode 271b, respectively, and are output as an electrical current. When the solar cell 270 comprises silicon, the operating voltage for generating the maximum output is about 0.5 V per cell. An ordinary power module has several to several tens of solar cells connected in series. In order to realize the series connection of solar cells, the lead wire 272, one end of which is fixed to the upper metal electrode 271a by the solder 273, is drawn beneath an adjacent cell and the other end of the lead wire 272 is fixed to a part of the lower metal electrode 271b of the adjacent cell by the solder 273. In this way, a plurality of solar cells connected in series are sealed by the resin 274, the surface glass 275, and the rear plate 276, resulting in a power solar cell module.

In the case of the thin film solar cell formed on the dielectric substrate 280 shown in FIG. 60(b), in order to connect a plurality of solar cells in series, the lower electrode 282b is formed on a part of the rear surface of the dielectric substrate 280 and then an end of the lead wire 283, the other end of which is fixed to the upper electrode 282a of an adjacent cell, is fixed to the lower electrode 282b by the solder 284.

FIGS. 61(a) and 61(b) are schematic diagrams showing the combined solar cell element disclosed in Japanese Published Patent Application 59-3980. As shown in FIG. 61(a), a surface electrode 291a of a solar cell 290 is connected to a rear electrode 291b of an adjacent solar cell by solder or a conductive adhesive agent 292. In this way, a plurality of solar cells 290 are stacked as shown in FIG. 61(a), realizing a series connection of solar cells. In this structure, although the series connection of solar cells is achieved in a simple process, the connecting portions are subjected to stress. Therefore, although this structure is applicable to power sources for domestic equipment, it is inapplicable to power modules using large cells, i.e., about 10 centimeters square, because of poor reliability.

FIG. 62 is a cross-sectional view showing the integrated amorphous solar cell disclosed in Japanese Published Patent Application 61-54681. In FIG. 62, transparent conductive films 301, amorphous silicon layers 302, and metal electrodes 303 are disposed on prescribed regions of an insulating substrate 300 whereby an upper electrode is connected to a lower electrode of an adjacent unit cell, realizing a monolithic series-connection on the same substrate. Lithography using a conventional photoresist or laser patterning has been employed as a method for separating the unit cells from each other. These techniques require complex process steps and production cost is high.

According to the background described above, a structure employing the connecting method as shown in FIG. 60(a) is generally used as a main current of a power solar cell module. However, the method for connecting solar cells in series shown in FIG. 60(a) requires the steps of:

1) soldering the lead wire 272, which is bent as shown in FIG. 60(a), onto the upper electrode 271a of each cell;

2) arranging each cell in a prescribed position so that an end of the lead wire of a cell may be in contact with a part of the rear electrode 271b of an adjacent cell;

3) turning all of the cells upside down; and 4) soldering the end of the lead wire onto the lower electrode 271b.

These steps are very complicated and cannot be easily automated.

In the solar cell module shown in FIG. 60(b), in addition to the above-described complex steps, it is necessary to form the lower electrode 282b on a part of the rear surface of the conductive electrode 280. In this case, the bonding strength between the conductive substrate 280 and the lower electrode 282b and the soldering strength between the lower electrode 282b and the lead wire 283 are not enough, resulting in an unreliable solar cell.

Japanese Published Patent Application 3-22574 discloses another method for connecting solar cells in series in which solar cells are connected by screws. This method also has a complex step of boring holes through a substrate for the screws. In addition, since the substrate supporting a powergenerating layer comprises metal, it is not possible to form a power-generating layer with superior characteristics.

SUMMARY OF THE INVENTION

An object of the present invention is to provide an inexpensive thin film solar cell with high performance and reliability produced in a simple process and a method for producing such a thin film solar cell.

It is another object of the present invention to provide a method for continuously producing a thin film semiconductor device which is used after being separated from a substrate.

It is still another object of the present invention to provide a highly reliable method for connecting a plurality of solar cells with high mechanical strength in a simple process and a highly reliable solar cell module produced by the method.

Other objects and advantages of the present invention will become apparent from the detailed description given hereinafter. It should be understood, however, that the detailed description and specific embodiments are given by way of illustration only since various changes and modifications within the spirit and scope of the invention will become apparent to those skilled in the art from this detailed description.

According to a first aspect of the present invention, in a method for producing a thin film solar cell, a graphite sheet substrate is directly heated by high frequency heating while a thin film is formed on the substrate. Therefore, the substrate is heated with high efficiency without damaging the substrate.

According to a second aspect of the present invention, in a method for producing a thin film solar cell, while a beltlike graphite sheet substrate successively passes through reaction chambers, a thin film semiconductor active layer is formed on a substrate, a cap layer, such as a silicon oxide layer or a silicon nitride layer, is then formed on the thin film semiconductor active layer, and the thin film semiconductor active layer is melted and recrystallized to increase the diameters of the crystal grains of the semiconductor active layer while it is covered with the cap layer. Therefore, the thin film layer is not condensed in islands. In addition, the reaction chamber is not contaminated by evaporation of the thin film layer.

According to a third aspect of the present invention, in a method for producing a thin film solar cell, two graphite sheet substrates are adhered at their first main surfaces, semiconductor thin films serving as active layers are formed on the second main surfaces of the graphite substrates, and the two graphite sheet substrates are separated from each other. In this structure, stress caused by the difference in thermal expansion coefficients between the upper substrate and the semiconductor thin film is cancelled by stress caused by a difference in expansion coefficients between the lower substrate and the thin semiconductor film. Therefore, curvature of the substrate is prevented, whereby the following process steps are easily carried out. In addition, the number of products produced per unit time is doubled, increasing productivity.

According to a fourth aspect of the present invention, in a method for producing a thin film solar cell, a graphite sheet substrate formed by rolling is hardened at a temperature in excess of 1,000° C. and then a thin semiconductor film serving as an active layer is formed on the substrate. Therefore, curvature of the substrate due to stress caused by the difference in thermal expansion coefficients between the graphite and the semiconductor is reduced.

According to a fifth aspect of the present invention, in a method for producing a thin film solar cell, a graphite sheet substrate formed by rolling is annealed at 3,000° C. or more in an HCl atmosphere and then a semiconductor thin film serving as an active layer is formed on the substrate. Therefore, a high performance thin film solar cell is obtained.

According to a sixth aspect of the present invention, in a method for producing a thin film solar cell, two graphite sheet substrates are partially adhered to each other with their first main surfaces inside so that a space is formed between the two sheets, and thin films are formed on the first main surfaces of the graphite substrates by introduction of a source gas into the space. Therefore, a reaction chamber for forming the thin films can be dispensed with.

According to a seventh aspect of the present invention, in a method for producing a thin film solar cell, the distance from a source gas inlet to an exhaust gas outlet of a reaction chamber for forming a thin film on a substrate is determined on the basis of flow rate, flow speed, and reaction speed of the source gas so that a greater part of the source gas is reacted before it reaches the exhaust gas outlet. Therefore, the source gas is used with high efficiency.

According to an eighth aspect of the present invention, in a method for producing a thin film solar cell, means for intercepting only a source gas is provided at an exhaust gas outlet of a reaction chamber in which a thin film is formed on a substrate. Therefore, the source gas is used with high efficiency.

According to a ninth aspect of the present invention, in a thin film solar cell, a supporting substrate having mechanical strength is adhered to a surface of a graphite sheet substrate opposite a surface on which a thin film is formed. Therefore, the mechanical strength of the thin film solar cell using the graphite sheet substrate is increased.

According to a tenth aspect of the present invention, in a method for producing a thin film solar cell, a graphite sheet substrate is fixed and tensioned by frames comprising carbon or ceramic, and a semiconductor thin film serving as an active layer is formed on the substrate. Therefore, curvature of the substrate due to stress caused by the difference in thermal expansion coefficients between the graphite and the semiconductor is avoided whereby subsequent process steps are easily carried out.

According to an eleventh aspect of the present invention, in a method for producing a thin film solar cell, a graphite sheet substrate is placed in a mold conforming to a hollow in the mold, metallurgical grade silicon powder is placed in the hollow containing the graphite sheet, and the mold is then heated and cooled to melt and harden the metallurgical grade silicon powder, resulting in a heat-resistant substrate in which a metallurgical grade silicon substrate is adhered to the rear surface of the graphite sheet. Then, a semiconductor thin film serving as an active layer is formed on the surface of the graphite sheet substrate. Therefore, a thin film solar cell having a high mechanical strength is easily produced.

According to a twelfth aspect of the present invention, a thin film solar cell comprises a substrate comprising mainly carbon, a first silicon layer disposed on the substrate, an insulating layer disposed on the first silicon layer and having apertures in a prescribed pattern, and a second silicon layer disposed on the insulating layer. In this structure, the substrate comprising mainly carbon and the insulating layer are securely connected to each other by the first silicon layer, resulting in a thin film solar cell having a high mechanical strength. In addition, since the second silicon layer does not directly contact the substrate, impurities in the substrate do not diffuse into the second silicon layer. Since the insulating layer is present on the first silicon layer, reflection of light at the rear surface of the second silicon layer is effectively utilized.

According to a thirteenth aspect of the present invention, a method for producing a thin film solar cell includes forming a first silicon layer on a substrate comprising mainly carbon, forming an insulating layer having apertures in a prescribed pattern on the first silicon layer, and forming a second silicon layer on the insulating layer so that it contacts the first silicon layer through the apertures. Therefore, a thin film solar cell with high performance and reliability is easily produced. More specifically, an amorphous silicon layer is formed on the first silicon layer and the insulating layer is formed on the amorphous silicon layer. Then, laser light is applied to the wafer according to the prescribed pattern whereby the portions of the amorphous silicon layer to which the laser light is applied break through the insulating layer, producing the apertures of the insulating layer. Since no wet process is required in forming the apertures, performance of the solar cell is further improved.

According to a fourteenth aspect of the present invention, a thin film solar cell comprises a graphite sheet substrate having a concavo-convex configuration and a semiconductor thin film disposed on the substrate. Therefore, a high performance thin film solar cell is produced in a simple process.

According to a fifteenth aspect of the present invention, a method for producing a thin film solar cell includes forming a semiconductor film on a beltlike first substrate, forming a p-n junction in the semiconductor film, adhering a second substrate to the semiconductor film, and separating the semiconductor film from the first substrate. The first substrate moves in its longitudinal direction while the process steps are continuously carried out. Therefore, a large quantity of thin film solar cells are continuously produced.

According to a sixteenth aspect of the present invention, in a solar cell module including a plurality of solar cells connected to each other, each cell is disposed on a conductive substrate having a lower hardness than a lead wire, and an end of the lead wire on each cell penetrates through or enters into the substrate of an adjacent cell whereby two cells are connected to each other. Therefore, a solar cell module having improved mechanical strength in the connecting part is easily produced.

According to a seventeenth aspect of the present invention, in a method for producing a semiconductor device, the end of a lead wire disposed on a surface of a cell is bent, and then the end of the bent portion is pressed on a prescribed part of a substrate of an adjacent cell whereby the end of the lead wire penetrates through or enters into the substrate of the adjacent cell. Therefore, a solar cell power module is produced in a simple process with a high throughput.

BRIEF DESCRIPTION OF THE DRAWINGS

FIGS. 9 to 11(d) are diagrams for explaining an example of a method for producing the thin film solar cell of FIG. 7;

FIG. 12 is a diagram for explaining another example of a method for producing the thin film solar cell of FIG. 7;

FIG. 15 is a cross-sectional view showing a structure of a thin film solar cell in accordance with a ninth embodiment of the present invention;

FIG. 16 is a cross-sectional view showing a method for increasing grain diameters of a silicon layer in a production method for producing the thin film solar cell of FIG. 15;

FIGS. 18(a) to 18(d) are cross-sectional views of process steps for producing the thin film solar cell shown in FIG. 15;

FIG. 19 is a cross-sectional view showing a structure of a thin film solar cell in accordance with a tenth embodiment of the present invention;

FIGS. 60(a) and 60(b) are diagrams showing prior art solar cell modules;

FIGS. 61(a) and 61(b) are diagrams showing another example of a prior art solar cell module: and FIG. 62 is a cross-sectional view showing still another example of a solar cell module.

DETAILED DESCRIPTION OF PREFERRED EMBODIMENTS

Figure 1:
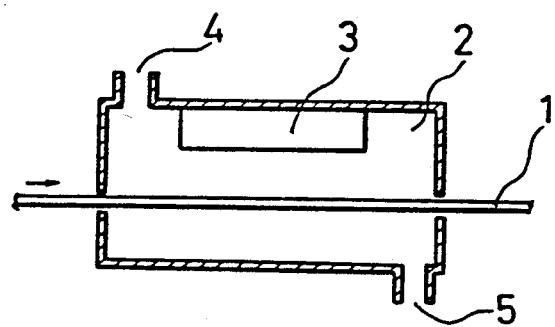
FIG. 1 is a schematic diagram showing a substrate heating method in a production method of a thin film solar cell in accordance with a first embodiment of the present invention.

FIG. 1 is a diagram showing a substrate heating method used for producing a thin film solar cell in accordance with a first embodiment of the present invention. A graphite sheet substrate 1 is fed into a thin film formation chamber 2 as shown by an arrow in FIG. 1 and heated by an induction heater 3. With conventional electrical heating, since the terminals of the heating power source are directly in contact with the substrate, the surface of the substrate is deformed or exfoliates. However, with the induction heating of the present invention, since no power supply terminals are connected to the substrate, deformation and exfoliation of the surface of the graphite sheet substrate 1 are prevented. In addition, in conventional electrical heating, an imperfect connection between the terminals and the substrate induces poor heating or temperature nonuniformity in the substrate. With induction heating, however, since heating is carried out evenly over the substrate, a semiconductor thin film having a uniform thickness is formed on the substrate. Further, with conventional lamp heating, light is reflected by the lustrous surface of the graphite sheet substrate, resulting in poor heating efficiency. Since the entire reaction chamber is heated, silicon is also deposited on the internal wall of the reaction chamber. However, with induction heating, heating efficiency is not reduced due to the lustrous surface of the substrate. Since only the conductive substrate is heated, heating efficiency is improved. Further, maintenance of the reaction chamber, i.e., to remove silicon deposited on the internal wall of the reaction chamber, can be dispensed with.

Induction heating has conventionally been used to heat a sintered carbon substrate. However, since the sintered carbon substrate is fragile and thick, a high power heater is required. Therefore, induction heating has not been an efficient heating method. According to the first embodiment of the present invention, since the graphite sheet is very thin and heated with less power, efficient heating is achieved by induction heating.

Figure 2:
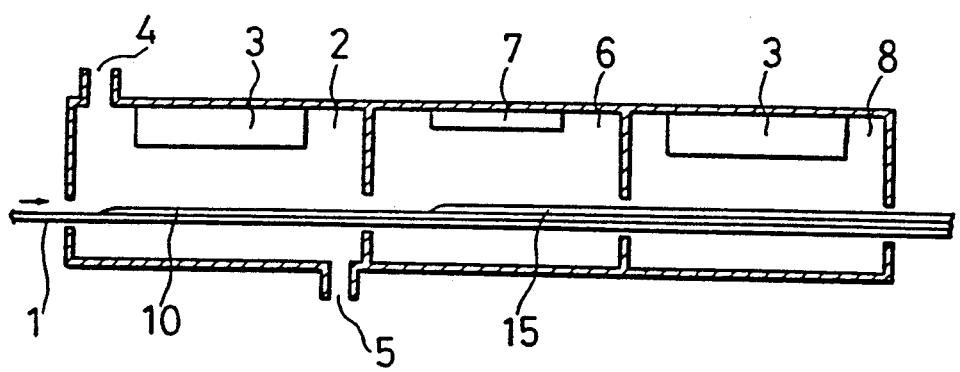
FIG. 2 is a schematic diagram showing a grain diameter enlargement method in a production method of a thin film solar cell in accordance with a second embodiment of the present invention.

In FIG. 2, the same reference numerals as in FIG. 1 designate the same or corresponding parts. The graphite sheet is fed into the thin film formation chamber 2 and heated by the induction heater 3. A source gas introduced into the chamber 2 through an inlet 4 reacts in response to the heat of the substrate 1 whereby a polycrystalline silicon thin film 10 is formed on the substrate 1. The substrate 1 on which the thin film 10 is formed is fed into a cap layer formation chamber 6. In the chamber 6, a cap layer 15 is formed on the silicon thin film 10 by a thermal CVD apparatus 7. The cap layer 15 prevents the polycrystalline silicon layer 10 from condensing and separating into islands while it is melted in a grain diameter enlargement chamber 8. The cap layer comprises an oxide film, a nitride film, or a laminate of these films. The cap layer has conventionally been used when the grain diameters of a polycrystalline silicon formed on a crystalline silicon substrate are increased. When using a flexible graphite sheet substrate, the graphite sheet substrate may be deformed due to the stress of the polycrystalline silicon so the cap layer is very important. After forming the cap layer 15, the substrate is transferred to the grain diameter enlargement chamber 8. In this chamber 8, the polycrystalline silicon is melted by induction heating to increase grain diameters.

Figure 3:
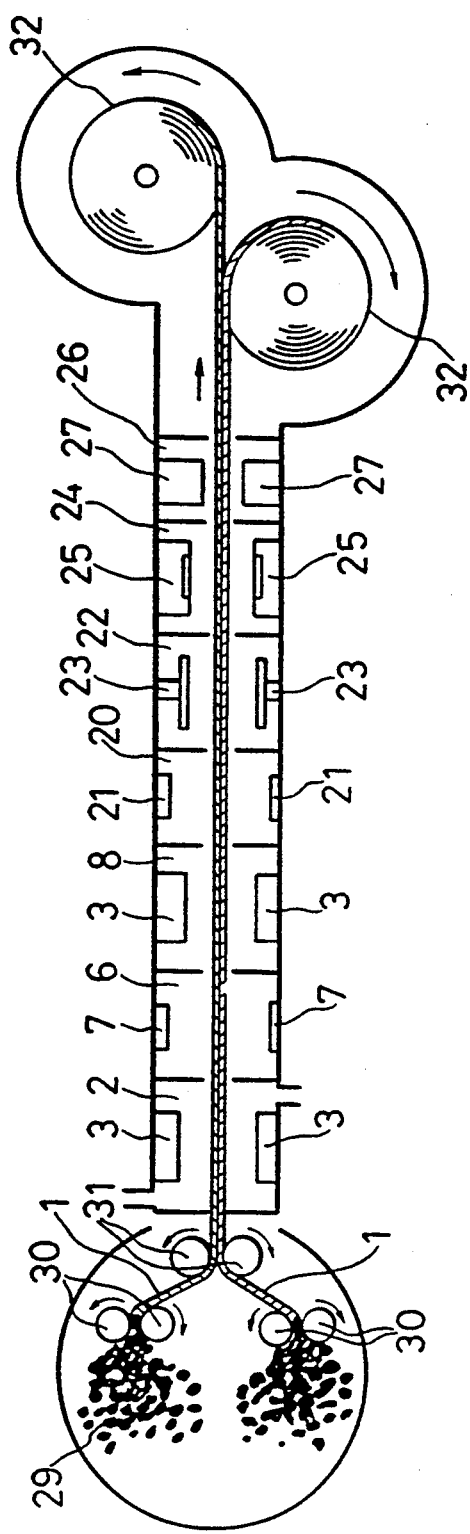
FIG. 3 is a schematic diagram of a method and apparatus for producing a thin film solar cell in accordance with a third embodiment of the present invention.
Figure 53:
FIG. 53 is a schematic diagram for explaining a problem when a thin film is formed on a graphite sheet.
Figure 54:
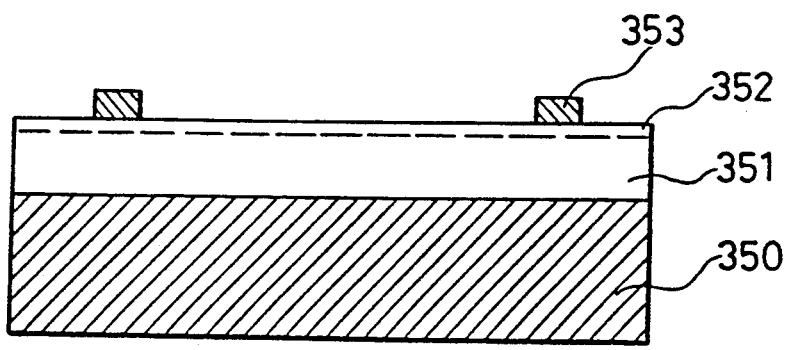
FIG. 54 is a cross-sectional view showing a prior art thin film solar cell using an MG-Si substrate.

FIG. 3 is a diagram showing a method for producing a thin film solar cell in accordance with a third embodiment of the present invention. In FIG. 3, the same reference numerals as those shown in FIGS. 1 and 2 designate the same or corresponding parts. Rollers 30 press flaky graphite which is purified and foamed by acid treatment, resulting in two sheets of graphite substrates 1. Rollers 31 press and adhere the two sheets of graphite substrates together and send the graphite sheets to the continuous reaction chambers. Rollers 32 separate and take up the two graphite sheet substrates. The graphite substrates are easily adhered to each other by only applying pressure from the rollers 31. An appropriate pressure is selected so that the two graphite sheet substrates may be easily separated at the final stage of the production process. A source gas, such as $SiH_4$ or $SiH_2Cl_2$, is introduced into the thin film formation chamber 2 through the gas inlet. The graphite substrate 1 in the reaction chamber 2 is directly heated to about 1,000° C. by the induction heaters 3 and the source gas is reacted on the heated graphite substrate 1 whereby polycrystalline silicon films, serving as active layers, are formed on both surfaces of the substrate 1. In this case, stress between the substrate and the upper thin film is cancelled by stress between the substrate and the lower thin film, preventing curvature of the graphite substrate, as shown in FIG. 53.

The graphite substrate having the polycrystalline silicon thin films is transferred to the cap layer formation chamber 6 where cap layers comprising an oxide film, a nitride film, or a laminate of these films are formed on the silicon thin films by thermal CVD or the like. Then, the substrate is transferred to the grain diameter enlargement chamber 9 where the polycrystalline silicon is melted and recrystallized by induction heating whereby the diameters of the crystal grains are increased. Thereafter, the substrate is transferred to a cap layer removal chamber 20 where the cap layers are removed by dry etching.

Then, the graphite substrate 1 is transferred to a p-n junction formation chamber 22. In this chamber 22, p-n junctions are formed in the silicon thin films by thermal diffusion of impurities. Thereafter, the substrate is transferred to an antireflection film formation chamber 24 wherein antireflection films are formed on the silicon thin films by sputtering. Thereafter, the substrate is transferred to an upper electrode formation chamber 26 wherein upper electrodes are formed by sputtering. Then, the substrate 1 is divided into two sheets, as before, and each sheet is taken up by the rollers 32. The two sheets of graphite substrates are respectively pressed by the rollers 30 and then adhered by applying a light pressure of 100 $g/cm^2$–1 $kg/cm^2$ by the rollers 31. Therefore, adhesion between them is relatively small so that they are easily separated from each other along the adhered surfaces.

In this third embodiment of the present invention, stress caused by a difference in thermal expansion coefficients between the substrate and the upper thin film is cancelled by stress caused by a difference in thermal expansion coefficients between the substrate and the lower thin film, preventing curvature of the substrate. In addition, since solar cells are formed on two substrates at the same time, productivity is doubled.

In this embodiment, when the substrate before the formation of the thin film is heated to over 1,000° C. and hardened, the curvature of the substrate is suppressed to some extent whereby the subsequent grain diameter enlargement process is easily carried out. In this case, the finished solar cells are not taken up by rollers but are successively cut in an appropriate length.

In this embodiment, when the graphite sheet formed by the rollers is annealed in an HCl atmosphere at about 3,000° C., the impurity concentration of the substrate is reduced, whereby performance degradation due to impurities mixing in the thin film is prevented.

Figure 4A:
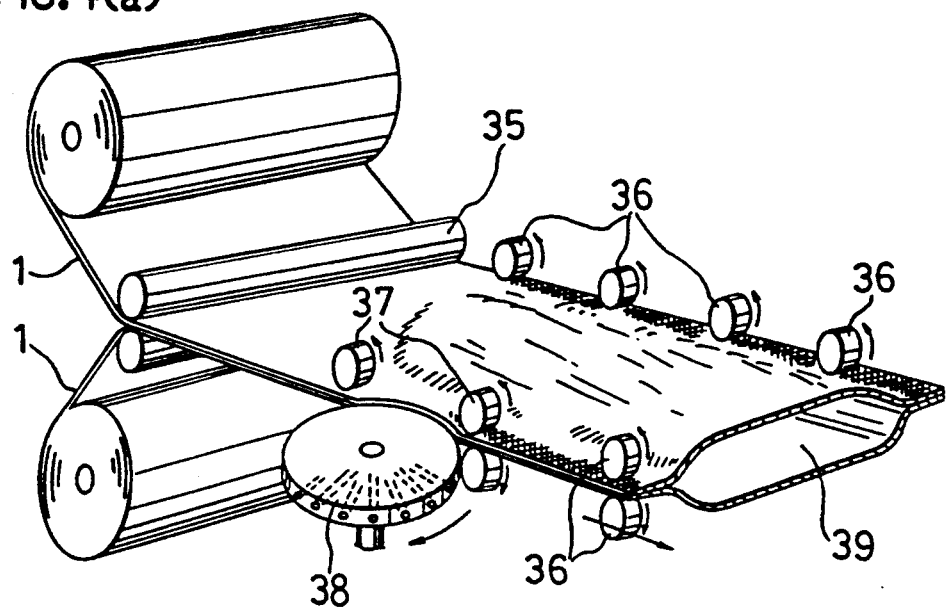
FIGS. 4(a) to 4(c) are diagrams illustrating a method for producing a thin film solar cell in accordance with a fourth embodiment of the present invention.
Figure 4B:
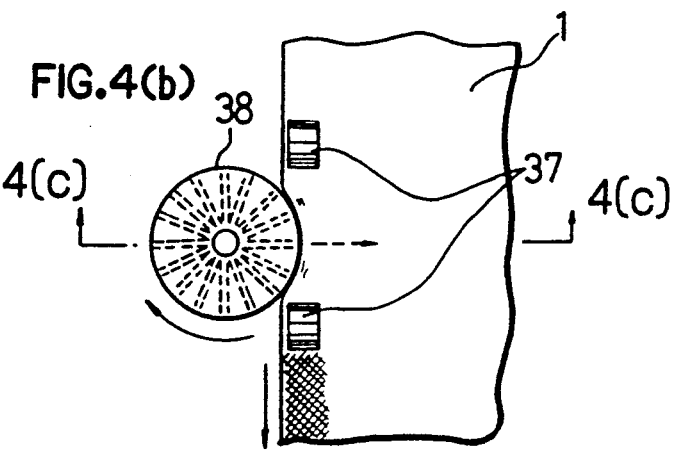
Figure 4C:
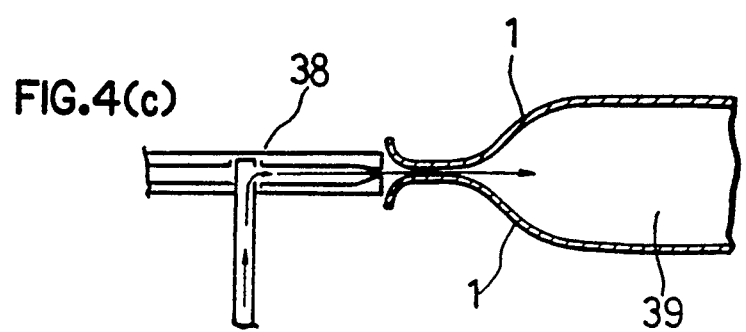

In order to continuously produce semiconductor thin films on the beltlike graphite sheet substrate, a reaction chamber, in which source gas flows to form the thin films, is required, resulting in a large production apparatus and complex maintenance. FIG. 4(a) shows a method for producing a thin film solar cell in accordance with a fourth embodiment of the present invention in which such a reaction chamber is dispensed with. In FIG. 4(a), rollers 35 press two sheets of graphite substrates 1 together and feed them out. Rollers 36 press and adhere both edges of the graphite substrates 1. A rotating source gas supply nozzle contacts the edges of the graphite substrates 1 and supplies a source gas into a reaction space 39 formed between the two sheets of graphite substrates from the edge. Rollers 37 hold the substrate at both sides of the position at which the source gas supply nozzle 38 contacts the substrates. FIG. 4(b) is a plan view showing the vicinity of the source gas supply nozzle 38 and FIG. 4(c) is a cross-sectional view taken along line 4(C)–4(C) of FIG. 4(b).

As described in the third embodiment, the graphite sheets are airtightly adhered only by applying pressure. An appropriate pressure is selected so that the two sheets of the graphite substrates may be adhered airtightly and separated easily at the final stage of the production process. In addition, since the graphite sheet is flexible, a space is formed between the two graphite substrates and, after producing solar cells, the substrates are returned to a flat plate shape.

The graphite substrates 1 are heated from the upper and lower sides by heaters or the like (not shown). A source gas supply nozzle 38 supplies a source gas from the edge of the substrates whereby a reaction space 39 filled with the source gas is formed between the substrates. In the reaction space 39, the source gas is reacted and semiconductor thin films are deposited on the internal wall surfaces of the substrates. Gas in the reaction space 39 may be drawn off by an exhaust nozzle (not shown) having the same structure as the source gas supply nozzle 38. Although it is not shown in the figure, the substrates are pressed and adhered in the width direction at an end of the reaction space 39. In this case, a low pressure is applied so that the thin films formed on the internal surfaces of the substrate are not destroyed. After forming the semiconductor thin films, the two sheets of the graphite substrates 1 are separated from each other. Thereafter, thin film solar cells are completed through a grain diameter enlargement process, a p-n junction formation process, and the like.

According to the fourth embodiment of the present invention, the two sheets of graphite substrates are pressed together with their main surfaces inside. Both edges of the substrates are adhered so that a space is formed between them. Then, source gas is introduced into the space to form semiconductor thin films on the main surfaces of the substrates. Therefore, a reaction chamber can be dispensed with.

While, in the above embodiments, enlargement of the grain diameters is performed after separating the two sheets of the graphite substrates, the enlargement of grain diameters may be performed as follows. A second reaction space is formed next to the reaction space 39 wherein cap layers are formed. In addition, a third reaction space is formed next to the second space wherein the thin films are melted and recrystallized to increase the grain diameters.

A conventional thin film reaction chamber used for continuously forming semiconductor thin films on a beltlike substrate has a source gas inlet at one end and an exhaust gas outlet at the other end. The distance between the inlet and the outlet is from several tens of centimeters to one meter. This distance is not enough to completely react the source gas introduced through the inlet before it reaches the outlet and the source gas is discharged before it is effectively utilized. More concretely, if the length of the reaction chamber is about 1 meter, only 10% of the source gas is reacted and contributes to the film formation. About 90% of the source gas is discharged from the outlet. This causes a serious problem because efficient use of the source gas is very important to reduce production costs.

Figure 5:
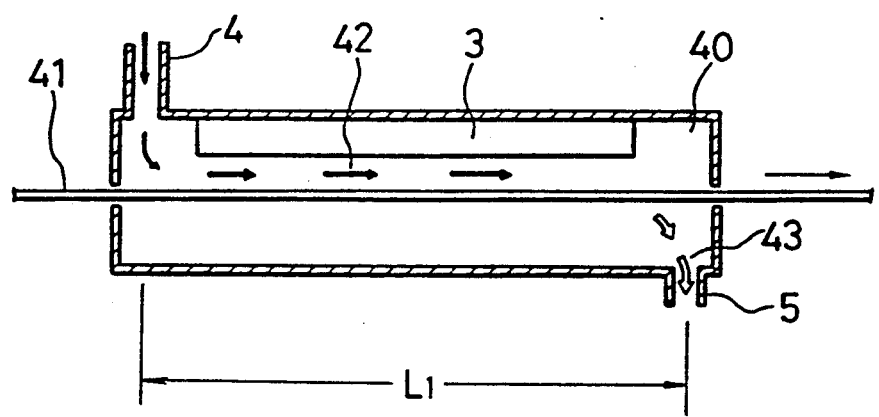
FIG. 5 is a diagram showing a structure of a thin film formation chamber used in a production method of a thin film solar cell in accordance with a fifth embodiment of the present invention.

FIG. 5 shows a method for producing a thin film solar cell in accordance with a fifth embodiment of the present invention in which the source gas is efficiently used. FIG. 5 shows a beltlike substrate 41, for example, a graphite sheet substrate, on which a semiconductor thin film is formed in a chamber 40. The substrate 41 is heated by an induction heater 3. A source gas 42 is introduced into the reaction chamber 40 through the gas inlet 4 and reacted by the heat of the substrate 41. A carrier gas 43 including the source gas and components of the source gas contributing to the film formation which are consumed is discharged from an exhaust gas outlet 5. In this embodiment, the distance between the source gas inlet 4 and the exhaust gas outlet 5, i.e., length $L_1$ of the reaction chamber 40, is selected so that a greater part of the source gas in the reaction chamber may be reacted before reaching the outlet 5. This length $L_1$ is selected on the basis of the flow rate or reaction speed of the source gas. For example, if the length $L_1$ is ten meters, about 60% of the source gas is reacted and contributes to the film formation.

Figure 6:
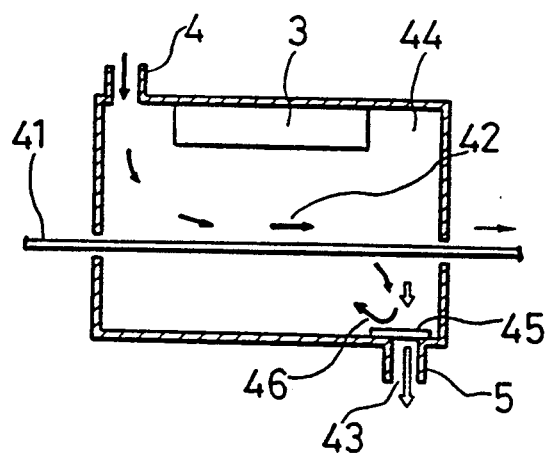
FIG. 6 is a diagram showing a structure of a thin film formation chamber used in a production method of a thin film solar cell in accordance with a sixth embodiment of the present invention.

FIG. 6 shows a method for producing a thin film solar cell in accordance with a sixth embodiment of the present invention in which a source gas is efficiently utilized. In FIG. 6, the same reference numerals as in FIG. 5 designate the same or corresponding parts. In the sixth embodiment, an exhaust gas outlet 5 is provided with a film 45, such as a platinum film, which is impervious to unreacted source gas. Therefore, only carrier gas and the reacted source gas components are discharged from the outlet 5 while the source gas, which is not reacted and reaches the outlet 5, does not pass through the platinum film 45 but remains in the reaction chamber, as shown by arrow 46. Since the unreacted source gas is not discharged, the source gas is effectively utilized. In this sixth embodiment, although the semiconductor thin film is continuously formed on the beltlike substrate, the semiconductor thin film may be formed one-by-one on individual substrates.

Figure 7:
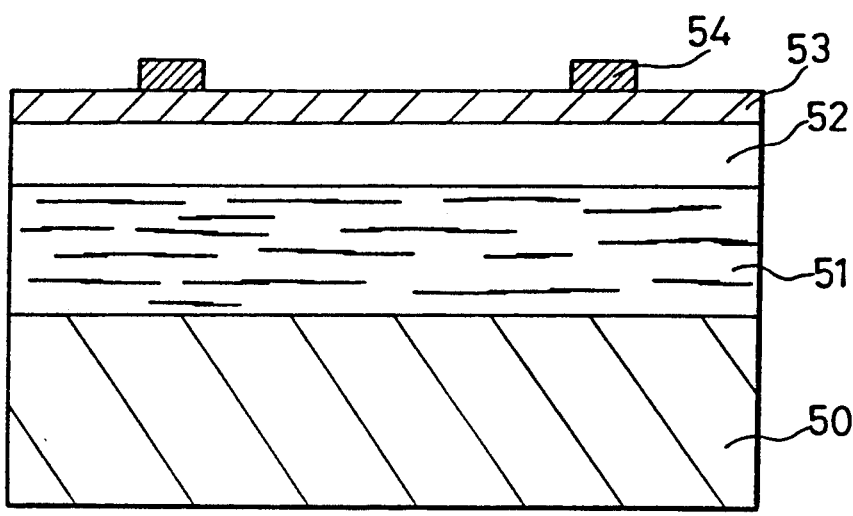
FIG. 7 is a cross-sectional view showing a structure of a thin film solar cell in accordance with a seventh embodiment of the present invention.

FIG. 7 is a cross-sectional showing a thin film solar cell in accordance with a seventh embodiment of the present invention. In FIG. 7, reference numeral 51 designates a flexible graphite sheet substrate. A polycrystalline silicon thin film 52 is disposed on the substrate 51. An anti-reflection film 53 is disposed on the silicon thin film 52. An upper electrode 54 is disposed on the anti-reflection film 53. A supporting substrate 50 comprising an inexpensive metal plate is adhered to the rear surface of the graphite sheet substrate 51 with silver or aluminum paste.

Figure 8:
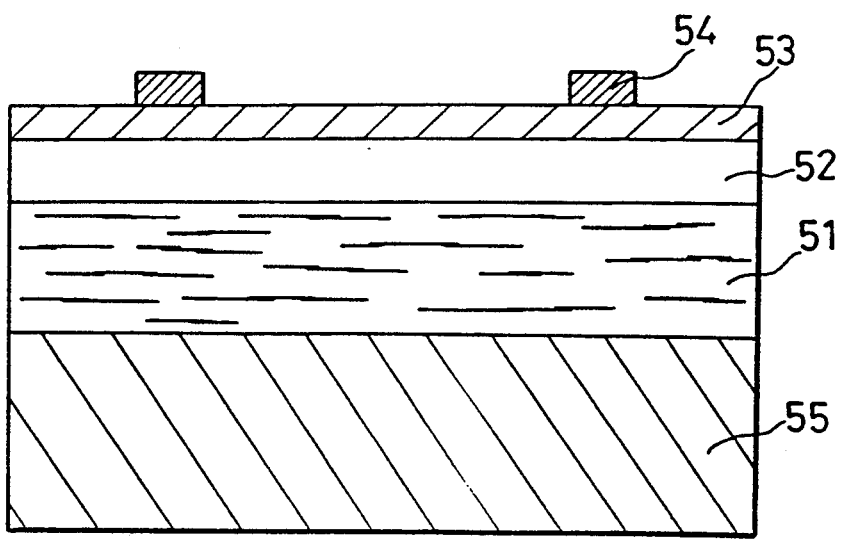
FIG. 8 is a cross-sectional view showing a structure of a thin film solar cell in accordance with an eighth embodiment of the present invention.

FIG. 8 is a cross-sectional view showing a thin film solar cell in accordance with an eighth embodiment of the present invention. In FIG. 8, the same reference numerals as in FIG. 7 designate the same or corresponding parts. A supporting substrate 55 comprising MG—Si and having a thickness of 300 microns or more is disposed on the rear surface of the graphite sheet substrate 51.

Figure 55:
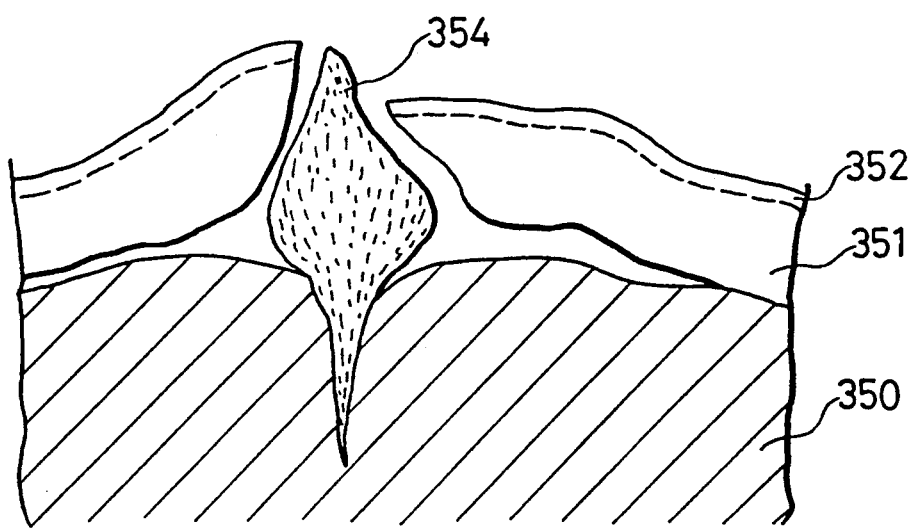
FIG. 55 is a schematic diagram showing a problem when a MG-Si substrate is used.

In a thin film solar cell using a graphite sheet as a substrate, since the graphite sheet is flexible, the mechanical supporting power of the substrate layer is not sufficient. In the production process, the difference in expansion coefficients between the graphite sheet substrate and the semiconductor thin film causes a curvature like that shown in FIG. 53, resulting in difficulty in the next step of increasing the grain diameters. On the other hand, when a metal plate, i.e., an MG—Si substrate, is used as a substrate, the mechanical supporting power of the substrate is increased. However, impurities in the substrate diffuse into the thin film while the thin film is formed, reducing performance of the solar cell. In addition, the active layer is degraded due to contamination by impurities, as shown in FIG. 55.

In the thin film solar cell according to the seventh embodiment of the present invention, an inexpensive metal plate 50 is adhered to the rear surface of the graphite sheet substrate 51 on which the semiconductor thin film 52 is formed with a metal paste. In the thin film solar cell according to the eighth embodiment of the present invention, the MG—Si substrate 55 is disposed on the rear surface of the graphite sheet substrate 51. In this way, even when the flexible graphite sheet is used as a substrate, the mechanical supporting power of the substrate to the semiconductor thin film is significantly increased.

Figure 9:
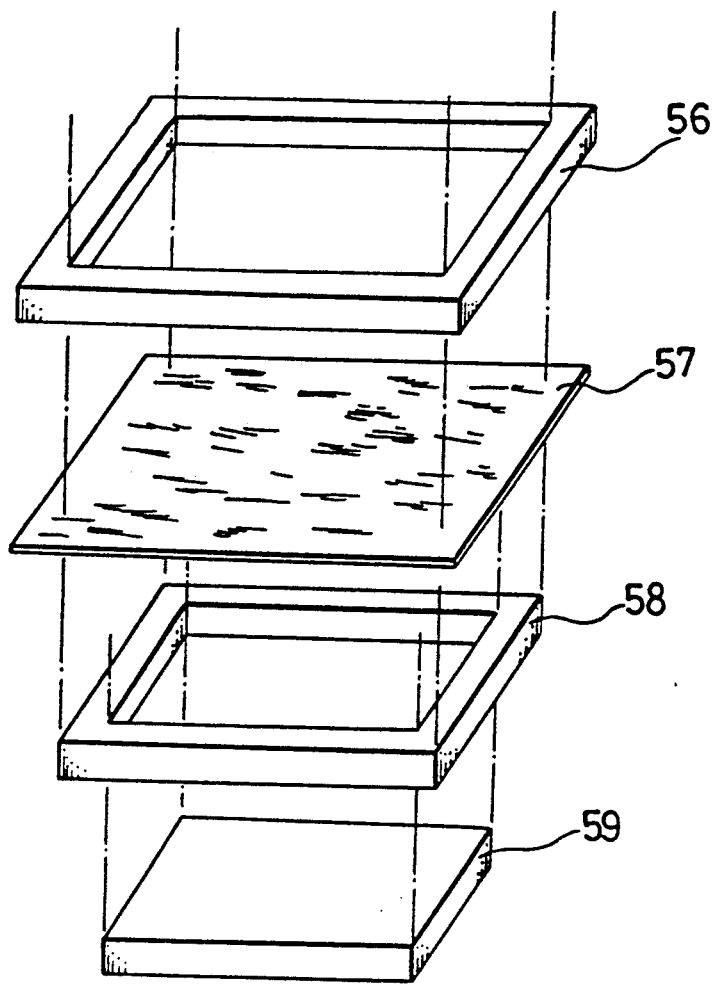
Figure 10:
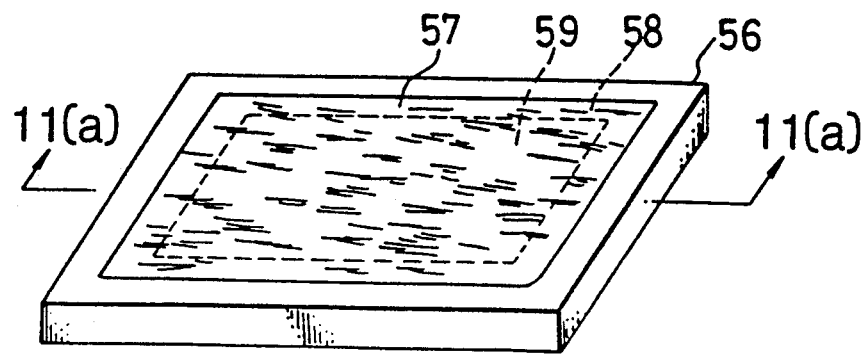

FIG. 9 is a perspective view showing a process for setting a graphite sheet substrate in a frame and FIG. 10 is a perspective view showing the graphite sheet substrate set in the frame.

First, a graphite sheet 57 is placed on an inner frame 58 and bent according to the size of the inner frame 58. Then, the inner frame 58 on which the graphite sheet 57 is placed is set in an outer frame 56 so that tension may be applied to the graphite sheet 57. Then, a soaked plate 59 is fed into the inner frame 58. Thus, a substrate shown in FIG. 10 having a center covered with the graphite sheet 57 is completed. FIGS. 11(a) to 11(d) are cross-sectional views taken along a line 11—11 of FIG. 10 showing process steps after the steps producing the article in FIG. 10. First, the substrate shown in FIG. 11(a) is placed in a CVD apparatus and a polycrystalline silicon thin film 60 several tens of microns thick is formed on the graphite substrate 57. Since the flexible graphite sheet 57 is held by the outer and inner frames 56 and 58, it never curves. Then, the polycrystalline silicon is melted and recrystallized to increase the grain diameters. Thereafter, a p-n junction is formed in the silicon film 60 by impurity diffusion or ion implantation. This p-n junction may be formed by changing the kind of dopant gas while the active layer is formed by CVD. In addition, the p-n junction may be formed by forming a microcrystalline film having a conductivity type opposite the conductivity type of the active layer on the silicon thin film 60 by plasma CVD.

After forming the p-n junction, an anti-reflection film 61 is formed by sputtering or the like. When the conductivity of the silicon thin film 60 in the transverse direction is low, a transparent electrically conductive film comprising ITO In$_2$O$_3$:SnO$_2$), SnO$_2$, or ZnO, or the like and also serving as an electrode is used as the anti-reflection film. When the conductivity of the silicon thin film in the transverse direction is high and no transparent electrode is needed, an insulating film comprising Si$_3$N$_4$ or the like is used as the anti-reflection film. FIG. 11(b) shows the anti-reflection film 61. Thereafter, an upper electrode (grid electrode) (not shown) is formed on the anti-reflection film 61. The upper electrode usually comprises silver and is formed by screen printing or vapor deposition. Then, as shown in FIG. 11(c), the soaked plate 59 is removed and, as shown in FIG. 11(d), an inexpensive metal plate 62 of the same size as the soaked plate 59 is adhered to the rear surface of the graphite sheet 57 with silver or aluminum paste and sintered. Finally, the outer frame 56 and the inner frame 58 are removed, resulting in a thin film solar cell.

The thin film solar cell may be formed without the soaked plate 59. In this case, the flexible graphite sheet is fixed by the outer frame 56 and the inner frame 58 in the same manner as described above and then the silicon thin film, the anti-reflection film, and the upper electrode are formed on the rear surface of the graphite sheet, i.e., the surface inside the inner frame 58. Then, the metal plate 62 is adhered to the opposite surface.

FIG. 12 shows a method for forming a polycrystalline silicon thin film over a large area using the outer and inner frames 56 and 58 used in the above-described production method. In this method, the flexible graphite sheet serves as a packing (gasket) of a CVD apparatus. In FIG. 12, the substrate 57 is heated by the induction heater 3. A source gas is introduced into the reaction chamber through the gas inlet 4 and reacted on the substrate whereby a thin film is formed on the substrate. After forming the thin film in this way, as in the above-described embodiment, a thin film solar cell is completed through process steps of increasing the grain diameters, forming a p-n junction, forming an anti-reflection film, forming an upper electrode, and adhering and sintering a metal plate.

Figure 13A:
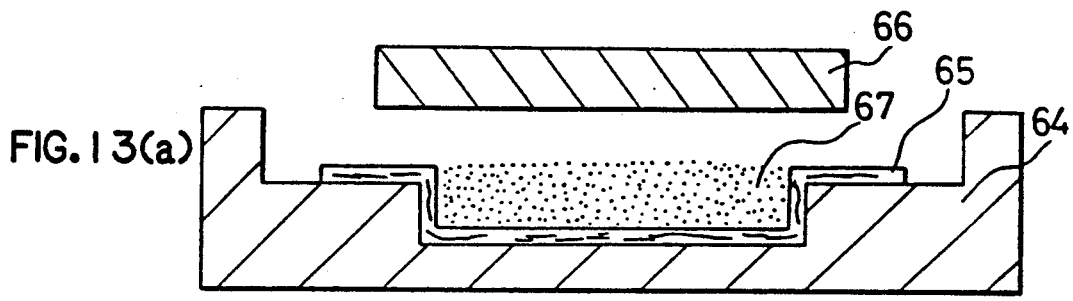
FIGS. 13(a) and 13(b) are diagrams for explaining an example of a method for producing the thin film solar cell of FIG. 8.
Figure 13B:
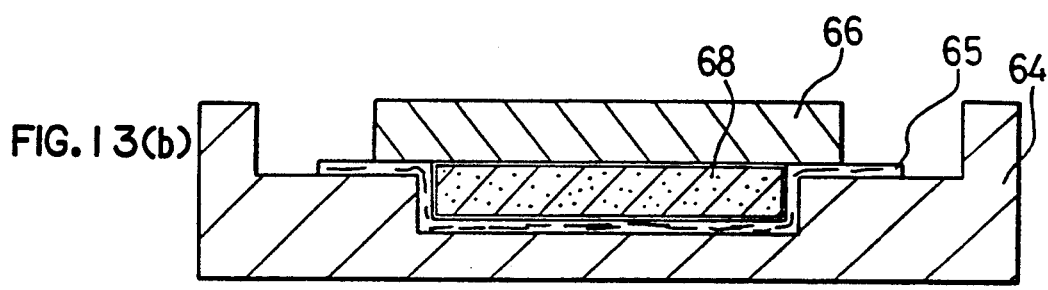

FIGS. 13(a) and 13(b) are cross-sectional views showing a method for producing the thin film solar cell shown in FIG. 8 in which an MG—Si supporting substrate is fixed to a graphite sheet. In these figures, reference numeral 64 designates a mold comprising boron nitride (BN). The mold 64 has a double-stage hollow and a graphite sheet 65 is disposed on the mold 64 along the shape of the hollow. MG—Si powder 67 fills in the deeper hollow of the mold 64. A lid 66 comprising BN is placed on the deeper hollow filled with the MG—Si powder 67.

The graphite sheet 65 is bent so that it may be adhered to the inner wall of the double-stage hollow of the mold 64 and then placed in the mold 64. Then, the hollow is filled with the MG—Si power 67 and covered with the lid 66. The MG—Si powder 67 is melted by heating and then solidified by cooling. As shown in FIG. 13(b), the MG—Si supporting substrate 68 is formed and the graphite sheet 65 is adhered to the supporting substrate 68. Thereafter, the substrate 68 is taken out from the mold 64 and unnecessary portions of the graphite sheet are cut off, resulting in a heat-resistant substrate in which the graphite sheet is adhered to the MG—Si supporting substrate.

The thin film solar cell shown in FIG. 8 is produced using the heat-resistant substrate thus formed. This heat-resistant substrate corresponds to the graphite substrate 51 and the MG—Si supporting substrate 55 shown in FIG. 8. This substrate is placed in a CVD apparatus and a source gas, such as SiH$_4$ or SiHCl$_3$, is introduced and reacted at a temperature as high as 1,000° C. whereby a polycrystalline silicon thin film 52 several tens of microns thick is formed on the graphite substrate 51. At this time, since the graphite substrate 51 is adhered to the MG—Si supporting substrate never curves due to stress caused by a difference in expansion coefficients between the graphite and the silicon. Then, the polycrystalline silicon is melted and recrystallized to increase the grain diameters. This process is easily carried out because the graphite substrate has no curvature. Thereafter, a p-n junction is formed in the silicon thin film 52 by impurity diffusion or ion implantation.

This p-n junction may be formed by changing the kind of the dopant gas while the active layer is formed by CVD. In addition, the p-n junction may be formed by forming a microcrystalline film having a conductivity type opposite the conductivity type of the active layer on the silicon thin film 52 by plasma CVD. After forming the p-n junction, an anti-reflection film 53 is formed by sputtering or the like. When the conductivity of the silicon thin film 52 in the transverse direction is low, a transparent electrically conductive film comprising ITO (In$_2$O$_3$:SnO$_2$), SnO$_2$, ZnO, or the like and also serving as an electrode is used as the anti-reflection film. When the conductivity of the silicon thin film in the transverse direction is high and no transparent electrode is needed, an insulating film comprising Si$_3$N$_4$ or the like is used as the anti-reflection film. Thereafter, an upper electrode (grid electrode) 54 is formed on the anti-reflection film 53. The upper electrode usually comprises silver and it is formed by screen printing or vapor deposition. Thus, the thin film solar cell shown in FIG. 8 is completed.

Figure 14:
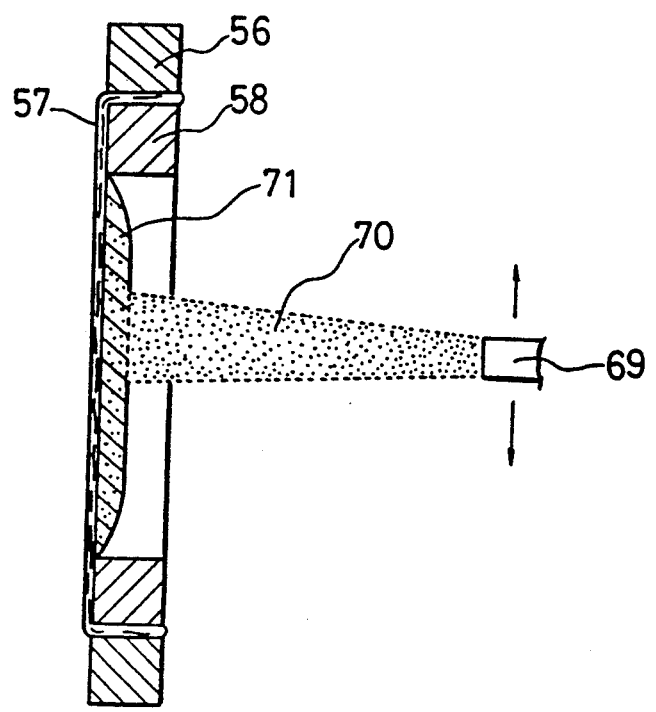
FIG. 14 is a diagram for explaining another example of a method for producing the thin film solar cell of FIG. 8.

While, in the above-described embodiment, the heat-resistant substrate in which the graphite sheet is adhered to the MG—Si supporting substrate is formed by molding, this substrate may be formed by the method shown in FIG. 14. More specifically, the graphite sheet 57 is fixed by the outer frame 56 and the inner frame 58 shown in FIG. 9 so that the graphite sheet is tensioned and then an MG—Si layer 71 is formed by a plasma spraying method. In FIG. 14, reference numeral 69 designates the nozzle of a plasma spraying apparatus (not shown). Reference numeral 70 designates MG—Si in its melted state. Since the nozzle 69 moves in the directions shown by arrows, the MG—Si supporting substrate having a uniform thickness is formed on the surface of the graphite sheet 57.

FIG. 15 is a cross-sectional view schematically showing a solar cell in accordance with a ninth embodiment of the present invention. In FIG. 15, reference numeral 72 designates a substrate comprising mainly carbon. A first silicon layer 73 is disposed on the substrate 72 and an insulating film 74 having apertures 78 is disposed on the first silicon layer 73. A second silicon layer 75 is disposed on the insulating layer 74 and contacts the first silicon layer 73 through the apertures 78. An emitter layer 76 is disposed on the second silicon layer 75. A metal electrode 77 is disposed on the emitter layer 76.

A method of producing the solar cell shown in FIG. 15 will now be described. The substrate 72 comprising mainly carbon mechanically supports the silicon layers 73 and 75 and serves as an electrode of the solar cell. The first silicon layer 73 is deposited on the substrate 72 by CVD or the like. The resistivity of the first silicon layer 73 should be so low that it does not prevent output current of the solar cell from flowing into the substrate 72 through the first silicon layer 73. For example, when the first silicon layer 73 is one micron thick, in order to have a resistance per unit area in the thickness direction of 0.01 $\Omega\cdot$cm$^2$ or below, the resistivity of the first silicon layer 73 is required to be 100 $\Omega\cdot$cm or below. The resistivity of the first silicon layer 73 should be as low as possible for reasons described later. When the first silicon layer is p-type, the first silicon layer 73 having a low resistivity is formed by mixing a gas including boron in the source gas.

Then, an insulating layer 74 is formed on the first silicon layer 73 by CVD or the like and apertures are formed through the insulating layer 74 according to a prescribed pattern. A silicon oxide film, a silicon nitride film, or a laminate of these films may be used as the insulating layer 74. When a silicon oxide film is used as the insulating layer 74, it serves as a barrier to impurities diffusing from the substrate 72 and as a rear surface reflection layer. However, when a silicon nitride film or a laminate of a silicon oxide film and a silicon nitride film is used, in addition to the functions described above, concordance between the insulating layer 74 and the silicon layer is improved so that the silicon layer is effectively melted and recrystallized in the later process.

Then, a second silicon layer 75 is formed on the wafer by CVD or the like. The second silicon layer 75 serves as a power-generating layer of the solar cell and has a thickness of 5–30 microns. When the first silicon layer 73 is p-type, the second silicon layer 75 should be p-type. The resistivity of the second silicon layer 75 is desirably 1 $\Omega\cdot$cm. The diameters of crystal grains of the second silicon layer 75 never exceed 1 micron when made by CVD, resulting in insufficient solar cell characteristics. Therefore, the second silicon layer 75 is melted and recrystallized to increase the crystal grain diameters whereby diameters twice as large as the thickness of the film are obtained. While the silicon layer 75 is melted and recrystallized, the surface of the silicon layer is covered with a cap layer 79, such as a silicon oxide layer, as shown in FIG. 16. The cap layer 79 is removed after the recrystallization. Before the formation of the second silicon layer 75, the first silicon layer 73 may be melted and recrystallized. In this case, since the first silicon layer 73 is directly in contact with the substrate 72 comprising mainly carbon, the first silicon layer 73 conforms to the substrate 72 during the melting and recrystallization so that the diameters of the crystal grains on the silicon layer 73 are easily increased. When the second silicon layer 75 is melted and recrystallized on the first silicon layer 73, since the second silicon layer 75 is in contact with the first silicon layer 73 through the apertures of the insulating layer 74, the silicon layer 75 takes the crystal orientation of the first silicon layer 73 while it is recrystallized, whereby the diameters of the crystal grains of the second silicon layer 75 are increased. When the second silicon layer 75 and the first silicon layer 73 are melted and recrystallized at the same time, if the first silicon layer 7 is solidified prior to the second silicon layer 75, the second silicon layer 75 takes the crystal orientation of the first silicon layer 73 when it is solidified, resulting in the same effect as described above. The silicon layers 73 and 75 having the large crystal grains improve performance.

Then, an emitter layer 76 having a conductivity type opposite the conductivity type of the second silicon layer 75 is formed on the second silicon layer 75 by diffusing impurities or forming a microcrystalline silicon film or an amorphous silicon film, whereby a p-n junction is produced. Further, a transparent electrically conductive film or an anti-reflection film (not shown) are formed as needed, Thereafter, a metal electrode 77 is formed to complete a solar cell.

In the solar cell described above, the insulating film 74 serving as a barrier to impurity diffusion is present between the second silicon layer 75 serving as a power-generating layer and the substrate 72, and the second silicon layer 75 is connected to the first silicon layer 73 through the apertures of the insulating layer 74. Therefore, the second silicon layer 75 is not in direct contact with the substrate 72 so that adverse effects due to impurity diffusion from the substrate 72, as in the conventional solar cell, are avoided.

Figure 17A:
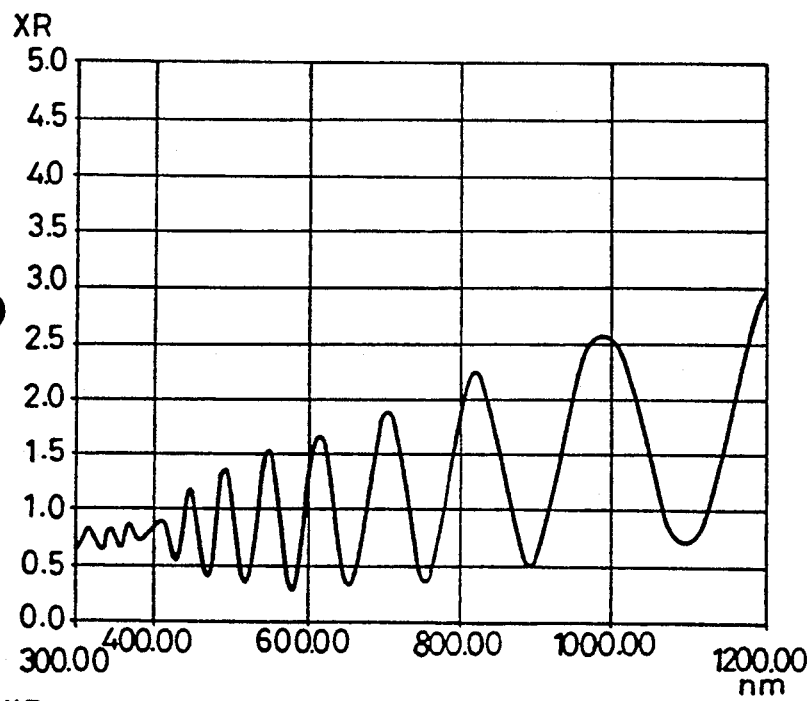
FIGS. 17(a) and 17(b) are graphs showing that a rear surface reflection effect of the thin film solar cell shown in FIG. 15 is effectively utilized as compared with the conventional solar cell.
Figure 17B:
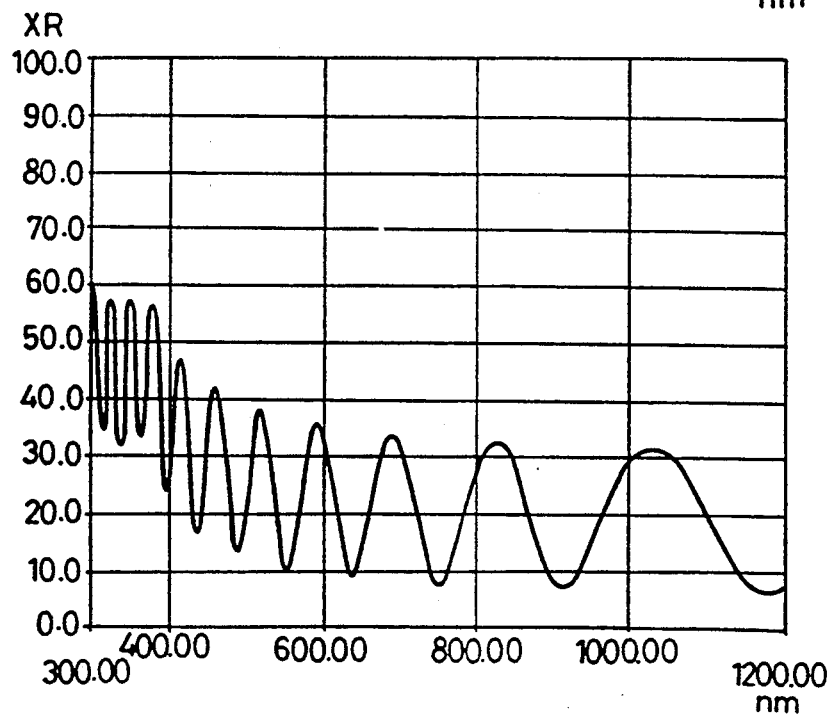

Since the insulating layer 74 is not formed directly on the substrate 72 comprising carbon but is formed on the silicon layer 73, the insulating layer 74 does not easily exfoliate from the substrate 72. When attention is given to the insulating layer 74 serving as a reflecting film at the rear face of the second silicon layer 75, reflection due to the difference in refractive indices between the second silicon layer 75 and the insulating layer 74 and reflection due to the difference in refractive indices between the first silicon layer 73 and the insulating layer 74, which are not realized in the conventional solar cell, are utilized so that the effect of the total reflection at the rear face of the silicon layer 75 is significantly improved. This fact is confirmed by FIGS. 17(a) and 17(b). In FIG. 17(a), reflectivities when a silicon oxide film is directly disposed on a substrate comprising mainly carbon are plotted against wavelength. In FIG. 17(b) reflectivities when a silicon oxide film is disposed on a crystalline silicon are plotted against wavelength. In FIG. 17(b), the scale of the ordinate is twenty times as large as that of FIG. 17(a), which means that the reflectivity is significantly increased when the silicon layer is present beneath the silicon oxide film.

In addition, since the first silicon layer 73 has a low resistivity, as mentioned above, when the second silicon layer 75 is disposed thereon, a so-called high-low junction is produced between these layers at the apertures of the insulating layer 74. This high-low junction produces a back surface field (BSF) and contributes to effective collection of the charge carriers generated during operation of the solar cell. This effect is not seen in conventional solar cells.

FIGS. 18(a) to 18(d) are cross-sectional views showing another method for producing the solar cell shown in FIG. 15.

First, a substrate 72 comprising mainly carbon, as shown in FIG. 18(a), is prepared. Then, as shown in FIG. 18(b), a first silicon layer 73 is formed on the substrate 72 by CVD or the like. Then, an insulating layer 74 is formed on the first silicon layer 73 by CVD or the like. More specifically, the surface of the first silicon layer 73 is covered with an amorphous silicon layer 80 and then the insulating layer 74 is formed. The amorphous silicon layer 80 is formed by, for example, plasma CVD. Thereafter, as shown by an arrow 81 in FIG. 18(c), laser light, such as argon laser light, is applied to prescribed portions of the insulating layer 74 where apertures are to be formed. Since the insulating layer 74 is transparent and hardly absorbs the laser light, it is difficult to pattern the insulating layer 74 with the laser light. In this case, however, the amorphous silicon layer 80 is present beneath the insulating layer 74 and the laser light is absorbed by the amorphous silicon layer 80. Portions of the amorphous silicon layer 80 heated by the laser light burst and protrude through the insulating layer 74, resulting in the apertures 82 shown in FIG. 18(d). Thereafter, the second silicon layer 75, the emitter layer 76, and the metal electrode 77 are successively formed to complete the structure shown in FIG. 15.

According to this method, the patterning of the insulating layer 74 is achieved without employing wet processing. Therefore, deterioration of performance due to moisture absorption of the substrate is prevented, resulting in a high performance solar cell. The amorphous silicon layer 80 is crystallized while the second silicon layer 75 and the emitter layer 76 are formed and united with the first silicon layer 73 so that it does not adversely affect the performance of the solar cell.

FIG. 19 is a cross-sectional view showing a thin film solar cell in accordance with a tenth embodiment of the present invention. In FIG. 19, reference numeral 83 designates a graphite sheet substrate having a concavo-convex configuration. A polycrystalline silicon thin film 84 is disposed on the substrate 83 and an anti-reflection film 85 is disposed on the polycrystalline silicon thin film 84. A grid electrode 86 is disposed on the antireflection film 85.

Figure 20:
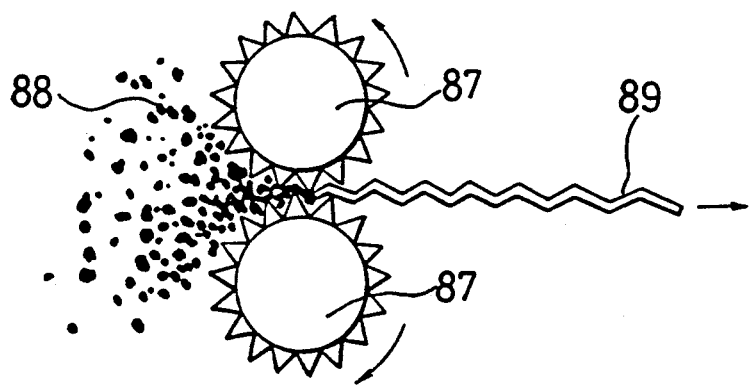
FIG. 20 is a schematic diagram showing an example of a method of forming a graphite substrate having a concavo-convex surface.
Figure 21:
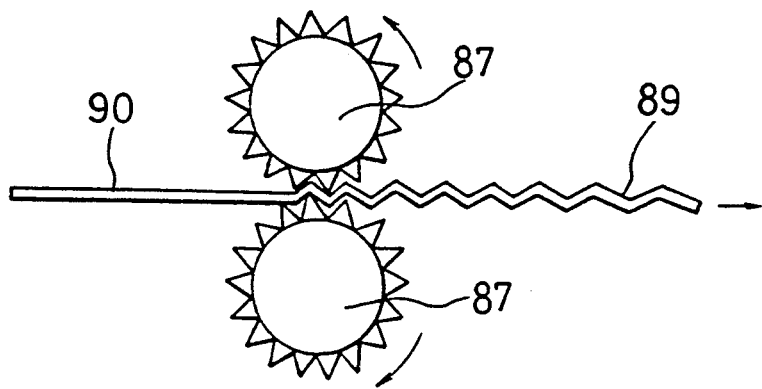
FIG. 21 is a schematic diagram showing another example of a method for forming a graphite substrate having a concavo-convex surface.

FIG. 20 schematically shows a method for producing the graphite sheet substrate 83. In FIG. 20, rollers 87 press a flaky graphite 88 purified and foamed by acid treatment to form a graphite sheet substrate 89. When the graphite 88 is pressed by the rollers 87, since the rollers 87 have concavo-convex surfaces, the surface of the graphite sheet substrate 89 also has a concavo-convex configuration. Alternatively, the graphite sheet substrate 89 may be formed as shown in FIG. 21. In FIG. 21, a graphite sheet 90, which is previously flattened, is pressed by the rollers 87 and formed into the concavo-convex configuration.

Figure 22:
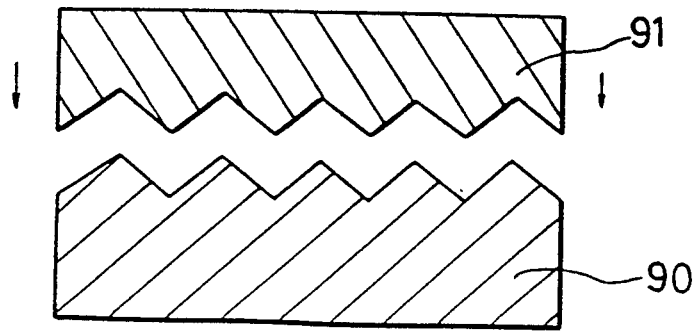
FIG. 22 is a schematic diagram showing still another example of a method for forming a graphite substrate having a concavo-convex surface.

Although both the upper and lower rollers 87 have the concavo-convex configuration in FIGS. 20 and 21, the shapes of the rollers may be changed so that the concavo-convex configuration may be formed on only one surface of the graphite sheet. In addition, as shown in FIG. 22, when a silicon (100) oriented wafer 91 on which a concavo-convex configuration is formed by anisotropic etching is pressed onto a graphite sheet 90, the concavo-convex configuration on the silicon wafer 91 is transcribed into the graphite sheet.

A description will now be given of a production method of the thin film solar cell shown in FIG. 19. The graphite sheet substrate 83 having the concavo-convex configuration is placed in a CVD apparatus and a source gas, such as $SiH_4$ or $SiHCl_3$, is introduced into the reaction chamber. The source gas is reacted at a temperature as high as 1,000° C. and a polycrystalline silicon thin film 84 several tens of microns thick is grown on the substrate 83. During the crystal growth, p-type impurities, such as boron, are incorporated into the silicon thin film 84. Since the diameters of the crystal grains of the silicon thin film 84 are small, the polycrystalline silicon is sometimes melted and recrystallized by laser heating or lamp heating to increase the diameters. Thereafter, a p-n junction is formed in the silicon thin film 84 by impurity diffusion or ion implantation. When the p-n junction is formed by impurity diffusion, for example, phosphorus (P) is used as a dopant. More specifically, phosphorus chloride ($POCl_3$) is introduced into the reaction chamber and a vapor phase diffusion is carried out at 700°–800° C. When the p-n junction is formed by ion implantation, for example, arsenic (As) is used as an ion source. In addition, the p-n junction may be formed by changing the kind of dopant gas while the active layer is formed by CVD. Further, the p-n junction may be formed on the active layer by forming a monocrystalline film having a conductivity type opposite the conductivity type of the active layer by plasma CVD.

After forming the p-n junction, an anti-reflection film 85 is formed by sputtering or the like. When the semiconductor layer 84 is an amorphous semiconductor layer or when the p-n junction is formed by depositing a monocrystalline film on the semiconductor layer 84, the conductivity of the semiconductor layer 84 in the transverse direction is low. In this case, a transparent conductive film comprising ITO ($In_2O_3:SnO_2$), $SnO_2$, ZnO, or the like and serving as an electrode is used as the anti-reflection film. When the conductivity of the silicon thin film in the transverse direction is high and no transparent electrode is needed, an insulating film comprising $Si_3N_4$ or the like is used as the anti-reflection film. When an insulating film comprising $Si_3N_4$ is used and the central wavelength of the incident light is 6,000 Angstroms, the thickness of the anti-reflection film should to 700 to 800 Angstroms.

Then, an upper electrode (grid electrode) 86 is formed on the anti-reflection film 85. The upper electrode usually comprises silver and is formed by screen printing or vapor deposition. The upper electrode 86 may be formed directly on the semiconductor layer 84 and then the anti-reflection film 85 may be formed on the upper electrode 86. In this case, the anti-reflection film 85 should be removed before a plurality of solar cells are electrically connected to each other.

Figure 56:
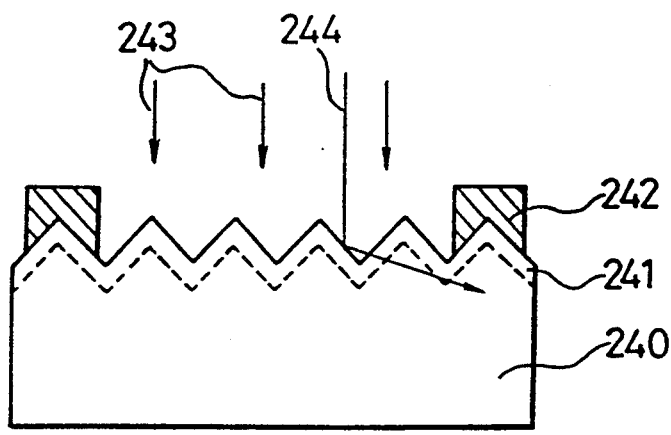
FIG. 56 is a cross-sectional view showing a prior art thin film solar cell using crystalline silicon.
Figure 57:
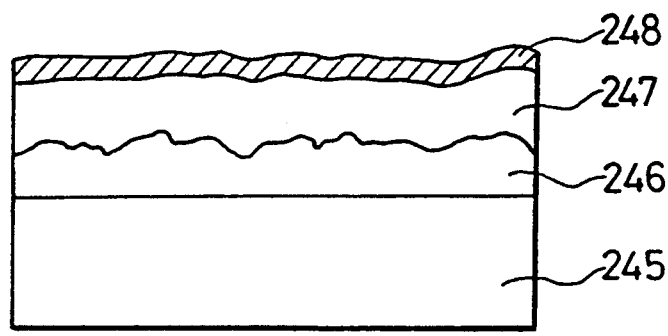
FIG. 57 is a cross-sectional view showing a prior art amorphous solar cell.
Figure 58:
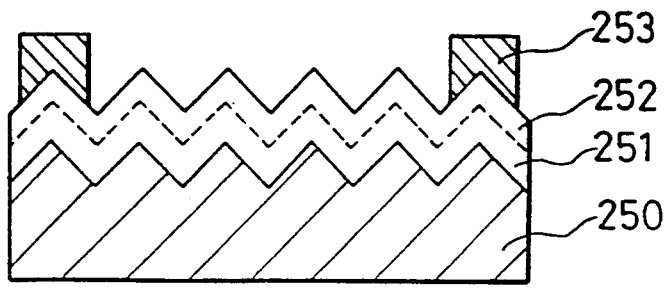
FIG. 58 is a cross-sectional view showing a prior art thin film solar cell in which the substrate has a concavo-convex surface.
Figure 59A:
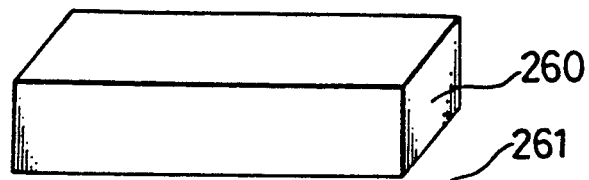
FIGS. 59(a) to 59(f) are perspective views of process steps for producing a thin film solar cell in which the thin film solar cell is finally separated from a substrate.
Figure 59B:
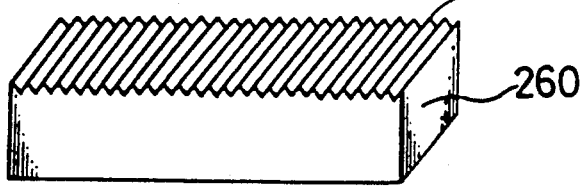
Figure 59C:
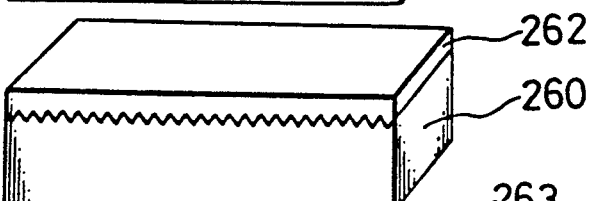
Figure 59D:
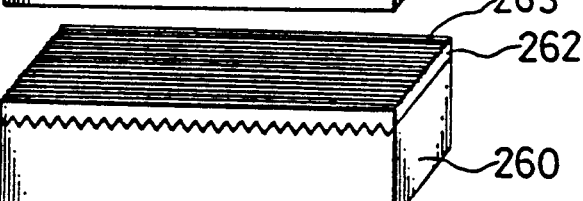
Figure 59E:
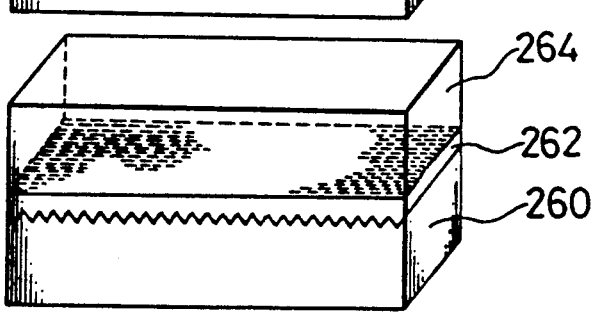
Figure 59F:
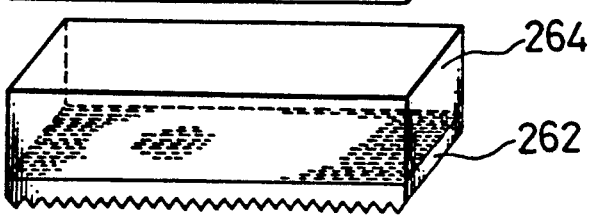

According to the tenth embodiment of the present invention, since the concavo-convex configuration of the graphite sheet substrate 83 is easily formed, as shown in FIGS. 20-22, the thin film solar cell shown in FIG. 19 is achieved at low cost. In addition, when the concavo-convex configuration is formed by the rollers 87, as shown in FIGS. 20 and 21, a desired configuration can be formed by changing the shapes of the rollers. With a conventional solar cell using the monocrystalline silicon substrate shown in FIG. 56, since the anisotropic etching is performed by chemical treatment, a concavo-convex configuration with a uniform angle is obtained. However, since, in the invention, the concavo-convex configuration is varied by changing the shapes of the rollers, a solar cell having an optimum angle or configuration that reduces reflection of incident light is achieved.

According to the methods shown in FIGS. 20 and 21, the beltlike graphite sheet 89 is continuously formed and then solar cells are formed thereon by a so-called roll-to-roll method, but this graphite sheet 89 may be used when the solar cells are formed individually, one-by-one.

While, in the above-described embodiment, a polycrystalline silicon film is used as the active layer, an amorphous silicon film or an amorphous silicon germanium film, which is used in an amorphous solar cell, or a $CuInSe_2$ film may be used as the active layer.

Figure 23:
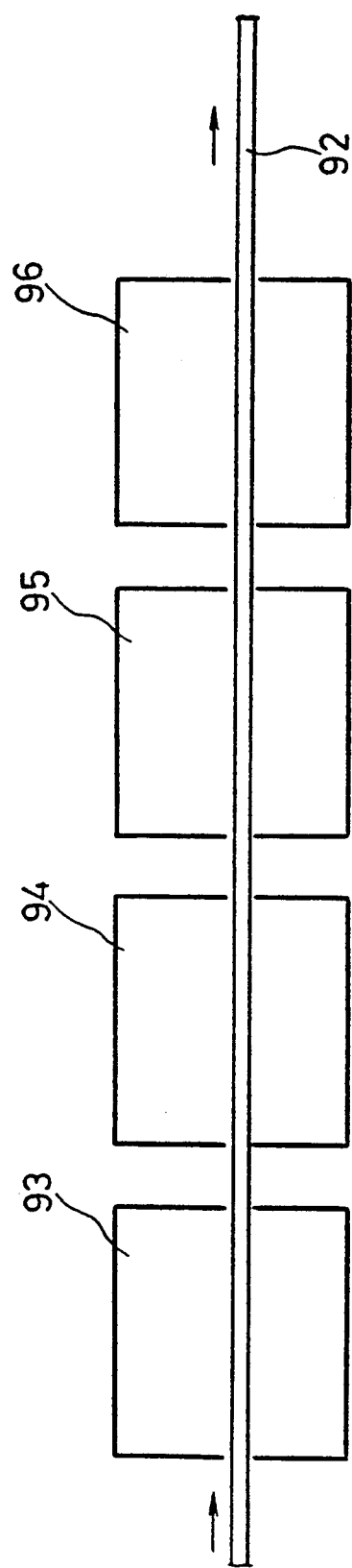
FIG. 23 is a schematic diagram showing a method for producing a thin film solar cell in accordance with an eleventh embodiment of the present invention.
Figure 24:
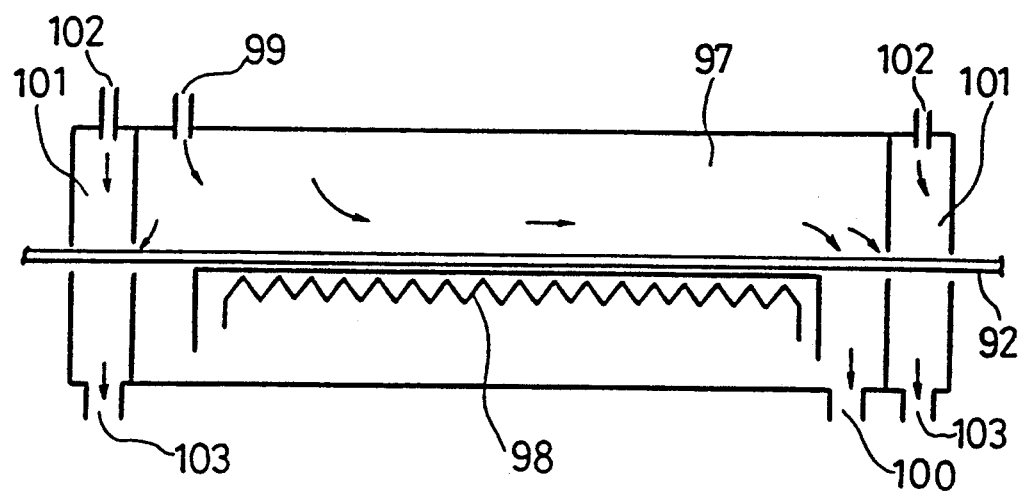
FIG. 24 is a diagram showing an apparatus for forming a semiconductor film in the production method shown in FIG. 23.

FIG. 23 is a schematic diagram showing a method for producing a semiconductor device in accordance with the eleventh embodiment of the present invention. A flexible and refractory material, such as a carbon cloth or a carbon sheet, is used as the first substrate 92. The first substrate 92 moves in the direction shown by the arrow and steps 93 to 96 are carried out in order. Each step will be described in detail. FIG. 24 shows an example of an apparatus in which a semiconductor film is formed.

In FIG. 24, the first substrate 92 fed into a reaction chamber 97 through a chamber 101 is heated by the heater 98. A source gas, such as silane, is introduced into a reaction chamber 97 through a gas inlet 99 and the gas is reacted and deposited on the first substrate 92, resulting in a semiconductor film. Arrows in FIG. 24 show the flow of the gas. Although the gas inlet 99 is provided at an end of the reaction chamber 97, since the substrate 92 moves slowly in the chamber, a semiconductor film having a uniform thickness is formed on the substrate 92.

Figure 25:
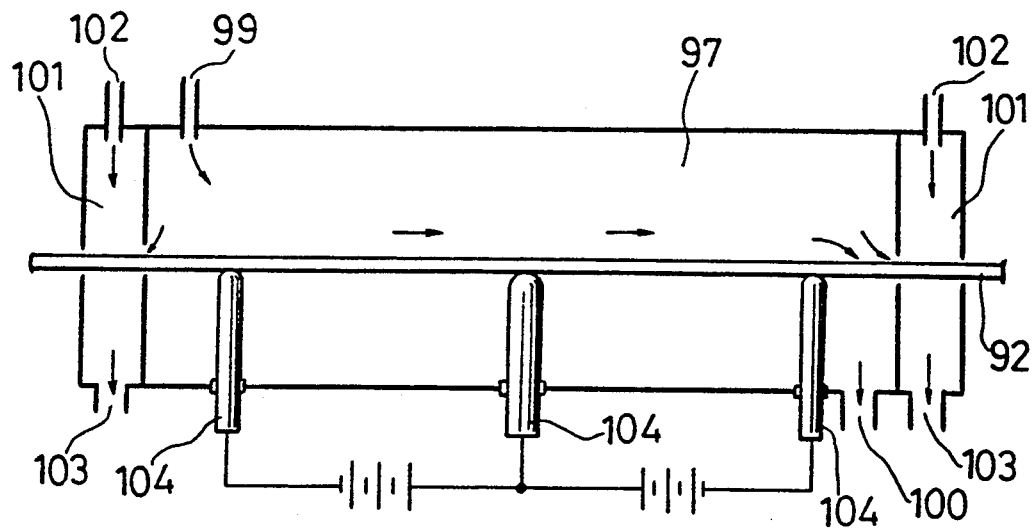
FIG. 25 is a diagram showing another apparatus for forming a semiconductor film in the production method shown in FIG. 23.

FIG. 25 shows another example of the apparatus in which a semiconductor film is formed. In FIG. 25, the same reference numerals as in FIG. 24 designate the same or corresponding parts. Since an electrically conductive carbon cloth or a carbon sheet is used as the substrate 92, the substrate 92 is heated when a current is applied to it. In this apparatus, an electrode 104 is connected to the substrate 92 and current is applied to the substrate to directly heat the substrate. Other structures are the same as those in FIG. 24. In addition, although the semiconductor film is formed by reacting the source gas, the semiconductor film may be formed by spreading a melted semiconductor material directly on the substrate 92.

Figure 26:
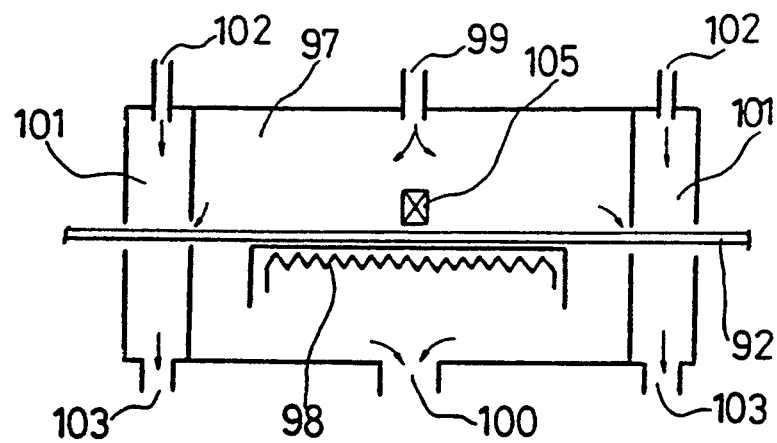
FIG. 26 is a diagram showing an apparatus for melting and recrystallizing the semiconductor film in the production method shown in FIG. 23.

The semiconductor film formed on the first substrate 92 in this way is a polycrystalline film. Therefore, in order to improve performance of the device, it is desired that the polycrystalline film be melted and recrystallized to increase the grain diameters and to monocrystallize the film. FIG. 26 shows an example of an apparatus in which the semiconductor film formed on the first substrate 92 in the apparatus shown in FIGS. 24-25 is melted and recrystallized. In FIG. 26, the same reference numerals as in FIG. 24 designate the same or corresponding parts. The substrate 92 fed into the reaction chamber 97 is heated by the heater 98 and then the semiconductor film on the substrate 92 is heated by a carbon strip heater 105 and partially melted. In this example, the strip heater 105 is fixed and the melted portion on the substrate beneath the heater moves with the movement of the substrate wherein a melted zone and recrystallization is carried out. Alternatively, after the substrate 92 moves a prescribed distance in the reaction chamber, it is stopped and the strip heater 105 is moved.

Figure 27:
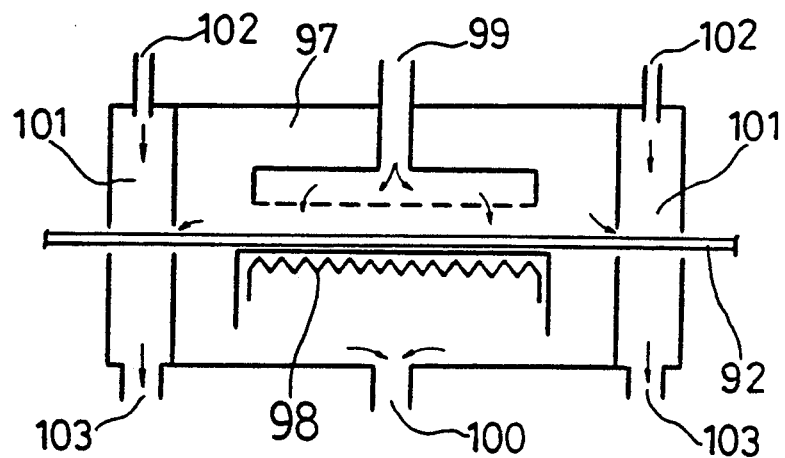
FIG. 27 is a diagram showing an apparatus for forming a separation film on a substrate before the formation of the semiconductor film in the production method shown in FIG. 23.

When a material having a smooth surface, such as a carbon sheet, is used as the first substrate 92, it is easy to form the semiconductor film directly on the substrate 92. However, if the surface of the substrate 92 is not smooth, it is necessary to make the surface smooth before the formation of the semiconductor film. As a method therefor, a separation film, such as a silicon oxide film, is formed on the substrate 92 before the formation of the semiconductor film to fill holes on the substrate. FIG. 27 shows an example of an apparatus for forming the separation film on the first substrate 92. In FIG. 27, the same reference numerals as in FIG. 24 designate the same or corresponding parts. The first substrate 92 transferred into the reaction chamber 97 is heated by the heater 98. Then, for example, silane and oxygen are introduced into the reaction chamber through the gas inlet 99 and a silicon oxide film is formed on the substrate 92.

Figure 28:
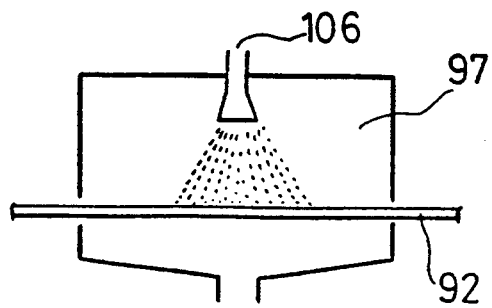
FIG. 28 is a diagram showing an apparatus for removing a protection film which is present on the semiconductor film while the semiconductor film is melted and recrystallized in the production method shown in FIG. 23.

When melting and recrystallization of the semiconductor film are carried out, the semiconductor film is covered with a cap layer, such as a silicon oxide layer, to form a high quality recrystallized film. In this case, the apparatus shown in FIG. 27 in which the cap layer is formed on the semiconductor film is inserted between the apparatus shown in FIGS. 24 or 25 and the apparatus shown in FIG. 26. After melting and recrystallization of the semiconductor film, the cap layer is removed in an apparatus shown in FIG. 28. Hydrofluoric acid or the like is sprayed on the cap layer from a nozzle 106, whereby the cap layer is dissolved and removed.

Figure 29:
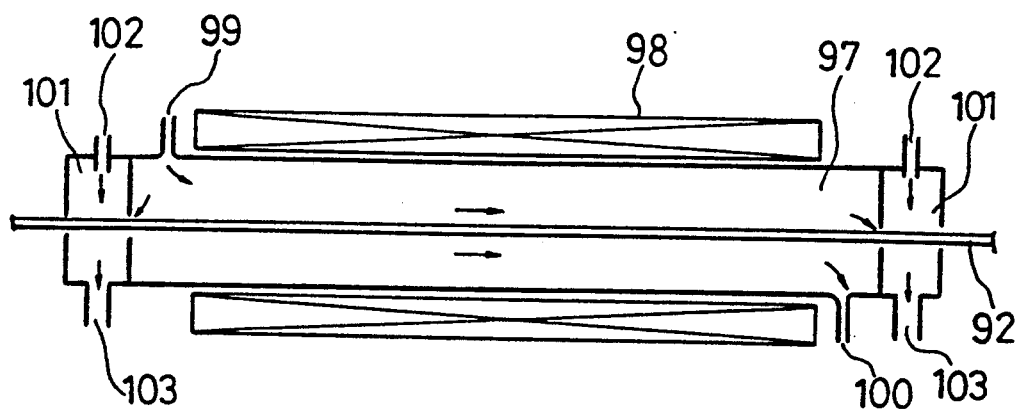
FIG. 29 is a diagram showing an apparatus for forming a p-n junction in the production method shown in FIG. 23.

FIG. 29 shows an example of an apparatus for forming a p-n junction in the semiconductor film formed on the first substrate 92. In FIG. 29, the same reference numerals as in FIG. 24 designate the same or corresponding parts. A reaction tube 97 is heated from the outside by heaters 98. A dopant gas is introduced into the reaction tube 97 through a gas inlet 99. The first substrate 92 on which the semiconductor film is formed is fed into the reaction tube 97. Then, the dopant gas flows through the gas inlet 99 and the reaction tube is heated by the heaters 98, whereby impurities are diffused into the semiconductor film to form a p-n junction. Also, in this case, although the gas inlet 99 is formed at an end of the reaction tube, since the diffusion is carried out while the substrate 92 moves slowly, a uniform diffusion occurs, resulting in a diffusion region with a uniform depth and a uniform impurity concentration.

Figure 30:
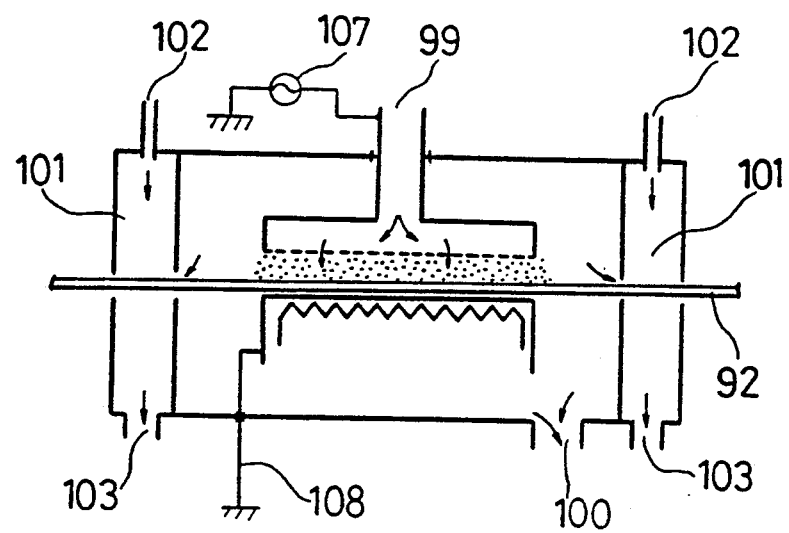
FIG. 30 is a diagram showing another apparatus for forming a p-n junction in the production method shown in FIG. 23.

FIG. 30 shows another example of the apparatus for forming the p-n junction. In FIG. 30, the same reference numerals as those in FIG. 24 designate the same or corresponding parts. In this apparatus, a high frequency from a generator 107 is applied to an electrode connected to a gas inlet 99 to generate a plasma. A dopant gas introduced into the reaction chamber is reacted in the plasma and an amorphous or microcrystalline film is deposited on the semiconductor film whereby a p-n junction is formed.

After producing the p-n junction in the semiconductor film, a second substrate is bonded on the semiconductor film. As an apparatus for bonding the second substrate, an ordinary robot hand or the like is used. The material of the second substrate and an adhesive agent are appropriately selected so that they are not etched by an etchant used in the subsequent steps.

Figure 31:
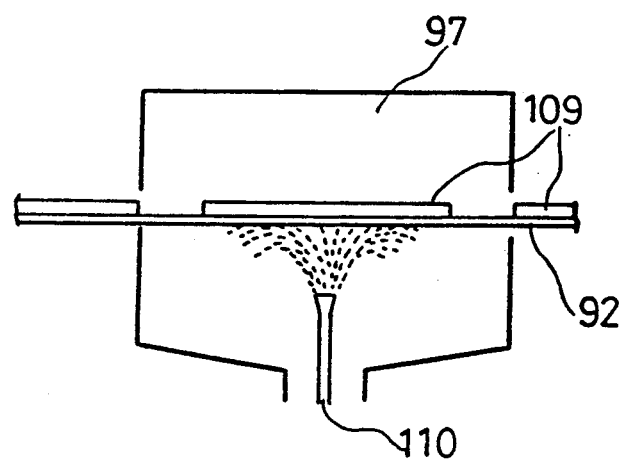
FIG. 31 is a diagram showing an apparatus for separating the substrate in the production method shown in FIG. 23.

FIG. 31 shows an example of an apparatus for separating the semiconductor film from the first substrate 92 in which an etchant nozzle 110 is provided beneath the first substrate 92. In FIG. 31, an etchant is sprayed on a portion of the first substrate 92 on which the second substrate 109 is formed from the rear surface of the first substrate 92. The etchant spreads into the first substrate 92. Outside of the reaction chamber, the semiconductor film and the second substrate 109 are separated from the first substrate 92. At this time, the semiconductor film is easily separated due to the etchant. The apparatus shown in FIG. 31 is used when the first substrate 92 is formed of a material into which the etchant easily percolates, such as a carbon cloth.

Figure 32:
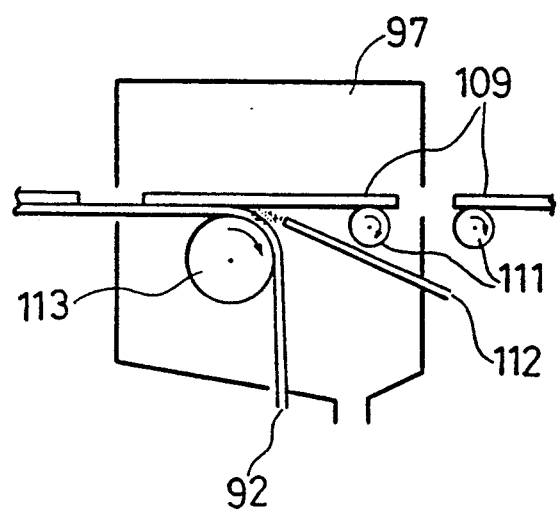
FIG. 32 is a diagram showing another apparatus for separating the substrate in the production method shown in FIG. 23.

FIG. 32 shows another example of the apparatus for separation of the semiconductor thin film from the first substrate 92. This apparatus is suitable when the first substrate 92 is formed of a material into which the etchant hardly percolates, such as a carbon sheet. In FIG. 32, a roller 113 separates the first substrate 92 from the semiconductor film and feeds the substrate 92 downward. Rollers 111 carry the semiconductor film on which the second substrate 109 is bonded. In FIG. 32, an etchant is sprayed between the first substrate 92 and the semiconductor film from a nozzle 112 while the first substrate 92 is bent by the roller 113 whereby the first substrate 92 is separated from the semiconductor film. Thereafter, the semiconductor film including the second substrate 109 is carried out of the chamber 97 by the rollers 111.

Thereafter, a protection film and an electrode are formed on the surface of the semiconductor film. In this embodiment, the semiconductor film is separated from the first substrate without destroying the first substrate. However, the separation of the semiconductor film and the first substrate may be performed by burning the first substrate or by dissolving the first substrate in a solvent. In these cases, however, reproduction of the substrate is required to repeatedly replace the burned or dissolved substrate. In addition, when an electrode or the like is required on the surface of the semiconductor film onto which the second substrate is bonded, it should be formed between the p-n junction process 94 and the second substrate bonding process 95.

Figure 33A:
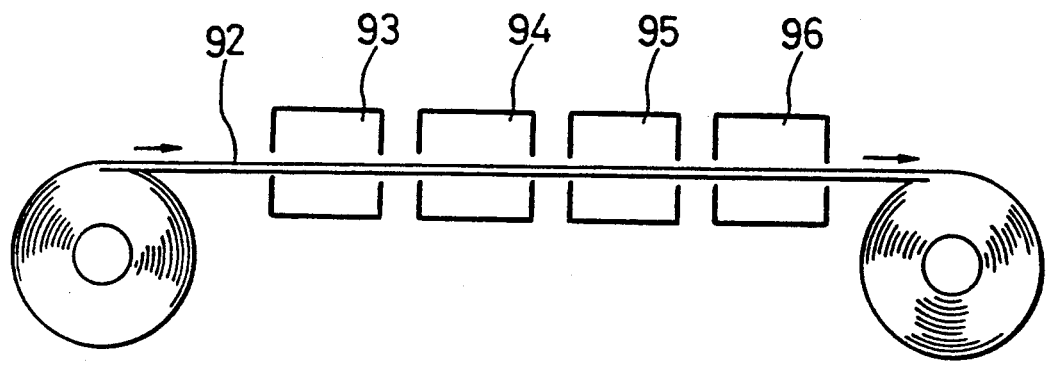
FIGS. 33(a) and 33(b) are diagrams showing an example of a substrate carrying mechanism used in the production method shown in FIG. 23.
Figure 33B:
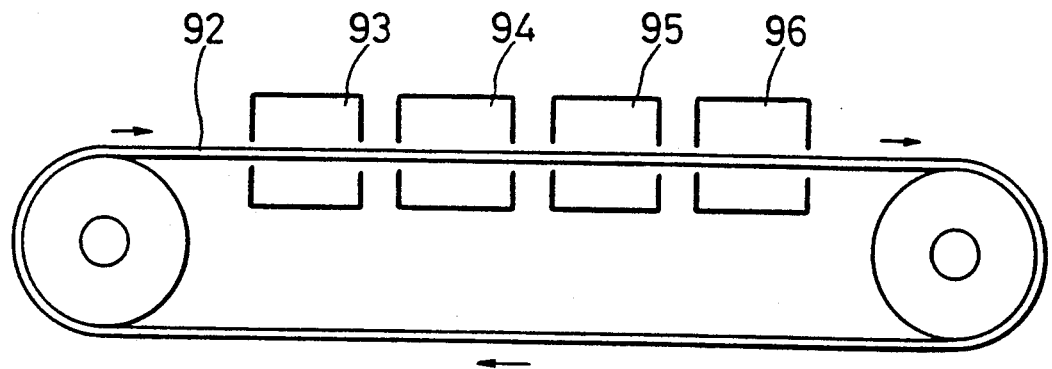

A conventional roll-to-roll method for carrying Alternatively, the belt conveyor method shown in FIG. 33(b) in which the first substrate is repeatedly used may be employed.

As described above, according to the eleventh embodiment of the present invention, step 93 of forming the semiconductor film on the first substrate, step 94 of forming a p-n junction of the semiconductor film, step 95 of bonding the second substrate to the semiconductor film, and step 96 of separating the first substrate from the semiconductor film are successively carried out while the beltlike first substrate moves in its longitudinal direction. Therefore, a large quantity of thin film solar cells are produced continuously. In addition, since the first substrate comprises carbon, high temperature processing is possible, resulting in a device of high quality.

While, in the above-described embodiment, the semiconductor film is formed by thermal CVD, it may be formed by plasma CVD. In this case, the apparatus shown in FIG. 30 is used.

In addition, although the process steps 93 to 96 are described with concrete examples, these steps may be carried out by other methods than those described above with the same effects as described above.

Figure 34A:
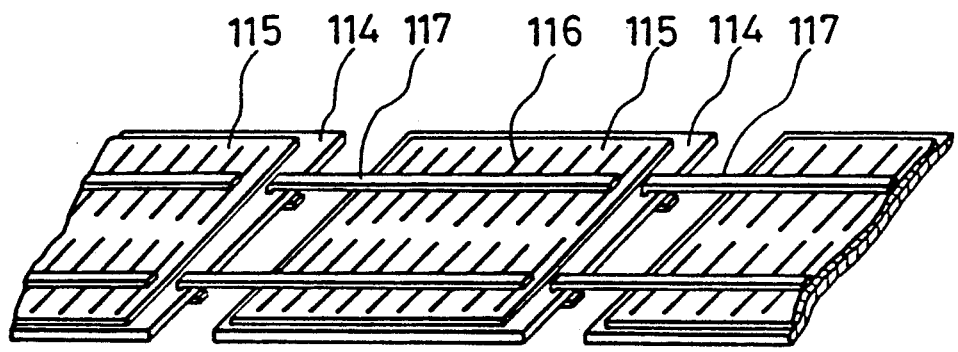
FIGS. 34(a) to 34(c) are diagrams showing a thin film solar cell array in accordance with a twelfth embodiment of the present invention.
Figure 34B:
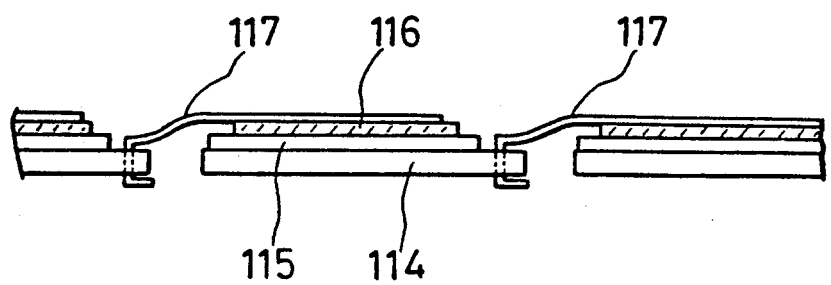
Figure 34C:
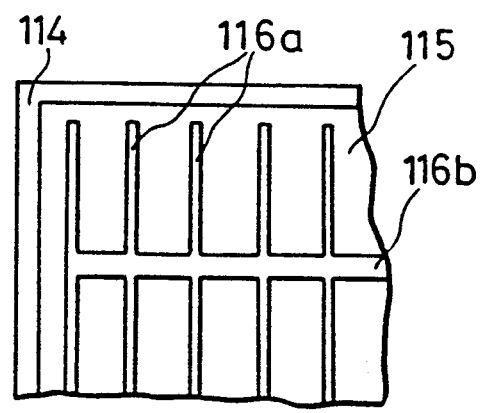

FIGS. 34(a) to 34(c) show a thin film solar cell in accordance with a twelfth embodiment of the present invention in which FIG. 34(a) is a perspective view, FIG. 34(b) is a cross-sectional view, and FIG. 34(c) is an enlarged view of a portion of FIG. 34(a). In these figures, reference numeral 114 designates an electrically conductive substrate, for example, a graphite sheet 0.1 to 0.5 millimeter thick, or a metal film comprising aluminum or the like. A power-generating layer 115 is disposed on the substrate 114. The power-generating layer 115 comprises, for example, an amorphous silicon alloy, polycrystalline silicon, or a compound semiconductor like CdTe or $CuInSe_2$. A surface electrode 116, comprising mainly Ag, is disposed on the power generating layer 115. The surface electrode 116 comprises a grid part 116(a) and a bus part 116(b), as shown in FIG. 34(c).

In order to reduce resistance loss when current is collected by the surface electrode, a copper wire 117 about 1 millimeter wide and 100 micrometers thick is connected to the bus part 116(b) of the surface electrode 116 with solder. This copper wire is coated with tin or solder in many cases. In this embodiment, the entire surface of the conductive substrate 114 is not completely covered by the power-generating layer 115, i.e., a part of the substrate 114 is exposed, and an end of a lead wire 117 penetrates through the exposed substrate 114 and bends, as shown in FIG. 34(b), to increase the connecting strength. In this structure, when a graphite sheet in which a crystal structure is parallel to the surface of the graphite sheet is used as the conductive substrate 114, the lead wire easily penetrates the substrate and electrical contact is improved.

In the conventional method for connecting a plurality of solar cells with each other, when a lead wire fixed onto an upper surface of a cell is connected to a rear surface of the adjacent cell, in order to avoid contact of the lead wire to the rear surface of the cell to which the lead wire is fixed or a conductive substrate of the cell, a spacing of 2-3 millimeters is required between adjacent cells. In this embodiment, however, since it is not necessary to connect the lead wire 117 to the rear surface of the adjacent cell, the lead wire 117 never contacts the rear surface of the cell on which it is fixed nor the side surface of the substrate 114. Therefore, the spacing between adjacent cells is reduced so that the power-generating area in a solar cell module is increased, resulting in a high power output. About a 0.5 millimeter spacing is appropriate for practical use.

In the structure shown in FIG. 34, although the exposed region of the conductive substrate 114 is large, the greater part of the substrate may be covered with the power-generating layer 115, leaving portions for connecting the lead wire 117 exposed.

Figure 35A:
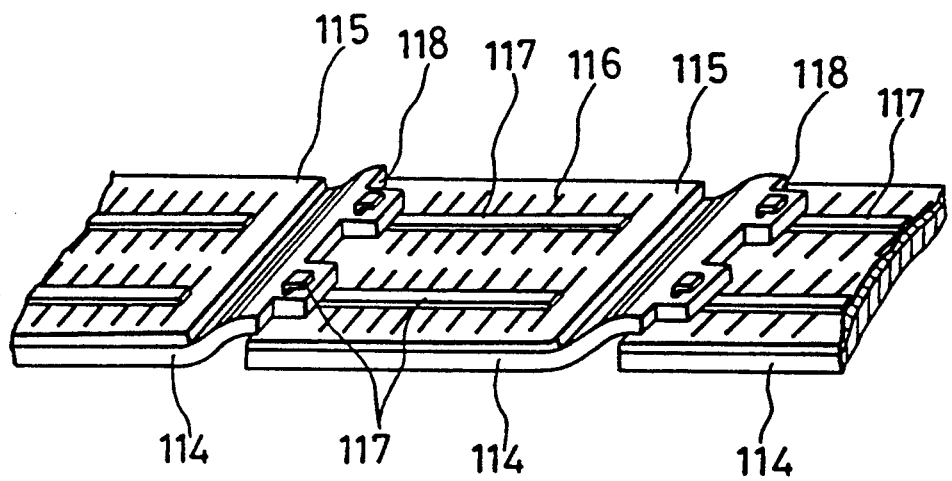
FIGS. 35(a) and 35(b) are diagrams showing a FIGS. 34(a)-34(c)
Figure 35B:
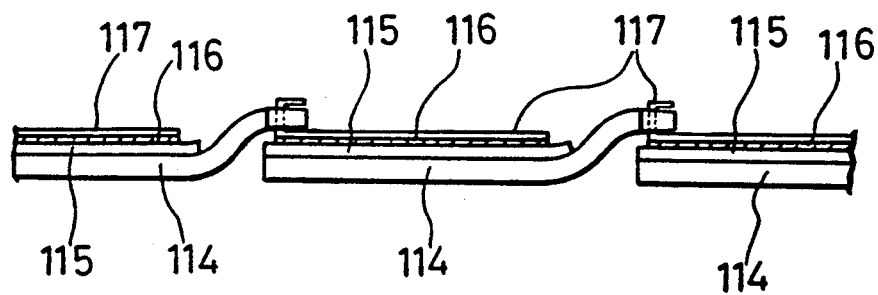

When a flexible material, such as a graphite sheet, is used as the conductive substrate 114, solar cells can be connected as shown in FIGS. 35(a) and 35(b). In these figures, an edge of the substrate 114 of a cell is placed on an edge of an adjacent cell and the lead wire 117 fixed on the adjacent cell penetrates through the edge of the substrate 114 from the rear surface of the substrate. Portions 118 of the substrate 114 on the adjacent cell are cut off, as shown in FIG. 35(a), to expose the power-generating layer 115 therebelow, thereby increasing the power generation of the module.

The power-generating layer 115 may be on the substrate 114 that is placed on the adjacent cells, leaving portions for connecting the lead wire 117 exposed. Also, in this case, the effective area that contributes to power generation is increased.

Figure 36:
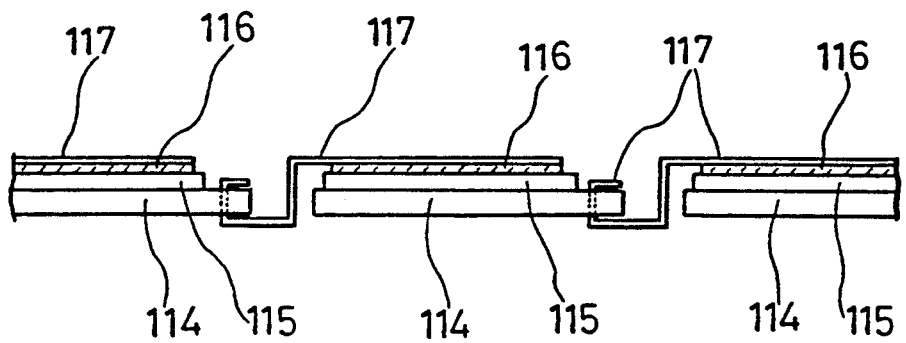
FIG. 36 is a diagram showing another variation of the thin film solar cell array shown in FIGS. 34(a)-34(c)

Alternatively, the connecting method shown in FIG. 36 is also possible. In FIG. 36, an end of a lead wire 117, the other end of which is fixed to a cell, is bent twice into an "L" shape and connected to a rear surface of an adjacent cell. Then, the lead wire 117 penetrates through the substrate of the adjacent cell from the rear surface. In this case, however, the spacing between adjacent cells must be increased so that the lead wire does not contact the substrate of the cell to which it is attached.

Figure 37:
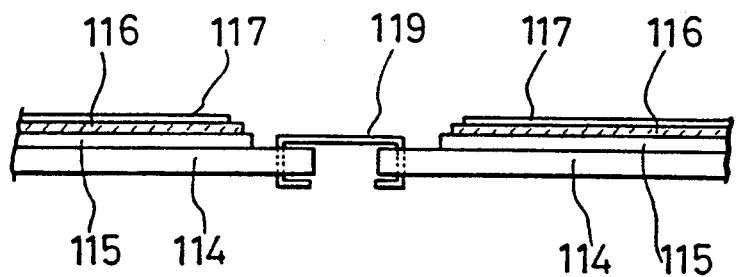
FIG. 37 is a diagram showing a method for connecting cells in parallel with each other in the thin film solar cell array shown in FIGS. 34(a)-34(c)

Although the solar cells are connected in series in FIGS. 34-36, the connection methods shown in FIGS. 34-36 may be applied to a parallel connection of solar cells. In this case, as shown in FIG. 37, the conductive substrates 114 of the adjacent cells are connected by a lead wire 119.

Figure 38:
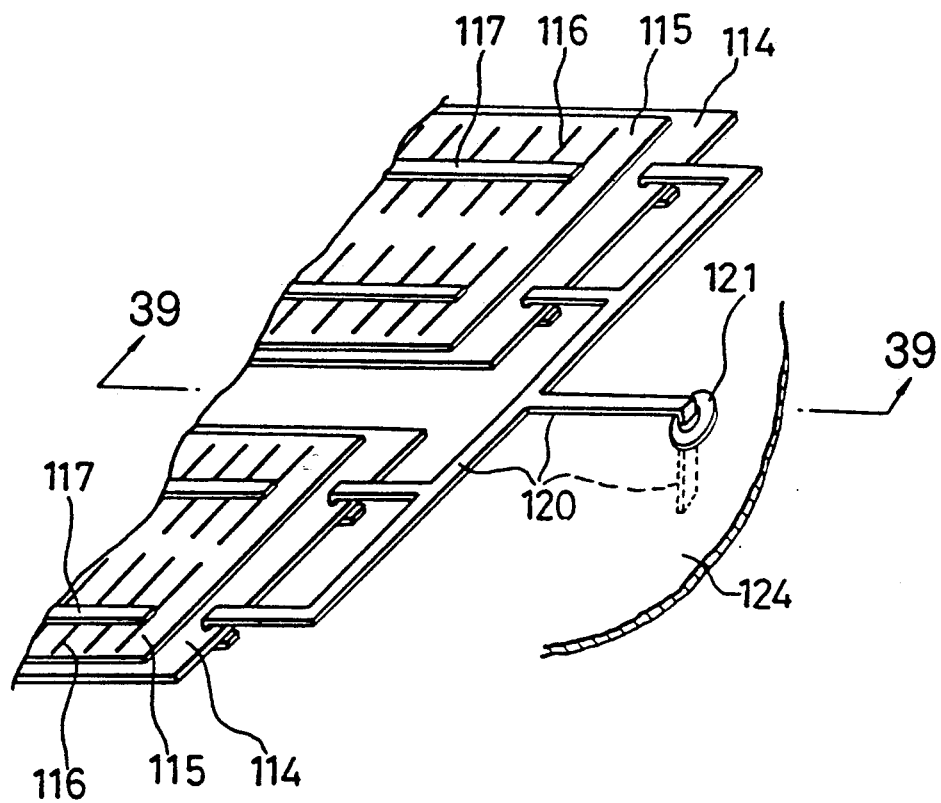
FIG. 38 is a diagram showing an electrode in the thin film solar cell array shown in FIGS. 34(a)-34(c)
Figure 39:
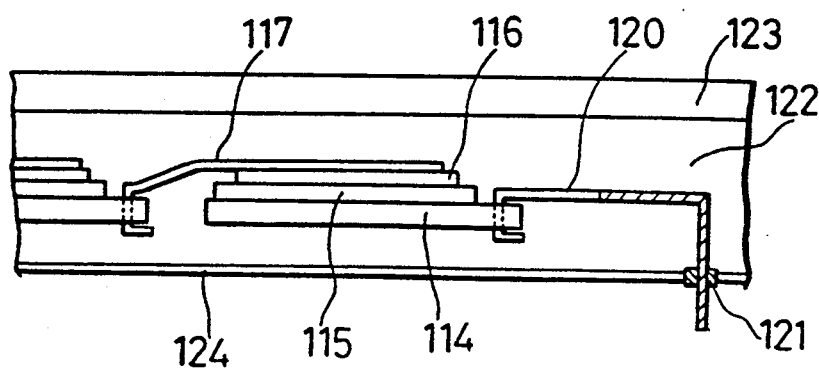
FIG. 39 is a cross-sectional view taken along line 39—39 of FIG. 38.

FIG. 38 shows a structure for connecting to a terminal electrode of a thin film solar cell module according to the twelfth embodiment of the present invention. In FIG. 38, reference numeral 120 designates a lead wire for connecting electrodes in parallel from conductive substrates 114 of two solar cell arrays which are parallel to each other. FIG. 39 is a cross-sectional view taken along line 39—39 of FIG. 38 in which a plurality of solar cells are sealed with resin 112 between a front surface glass sheet 123 and a rear plate 124. Since the rear plate 124 comprises a metal, such as aluminum, an insulator 121 comprising an insulating rubber or the like is provided between the rear plate 124 and the lead wire 120 to avoid short-circuiting.

In this way, a plurality of solar cell arrays are electrically connected in parallel by the lead wire 120 wherein a high power thin film solar cell module is achieved.

Figure 40:
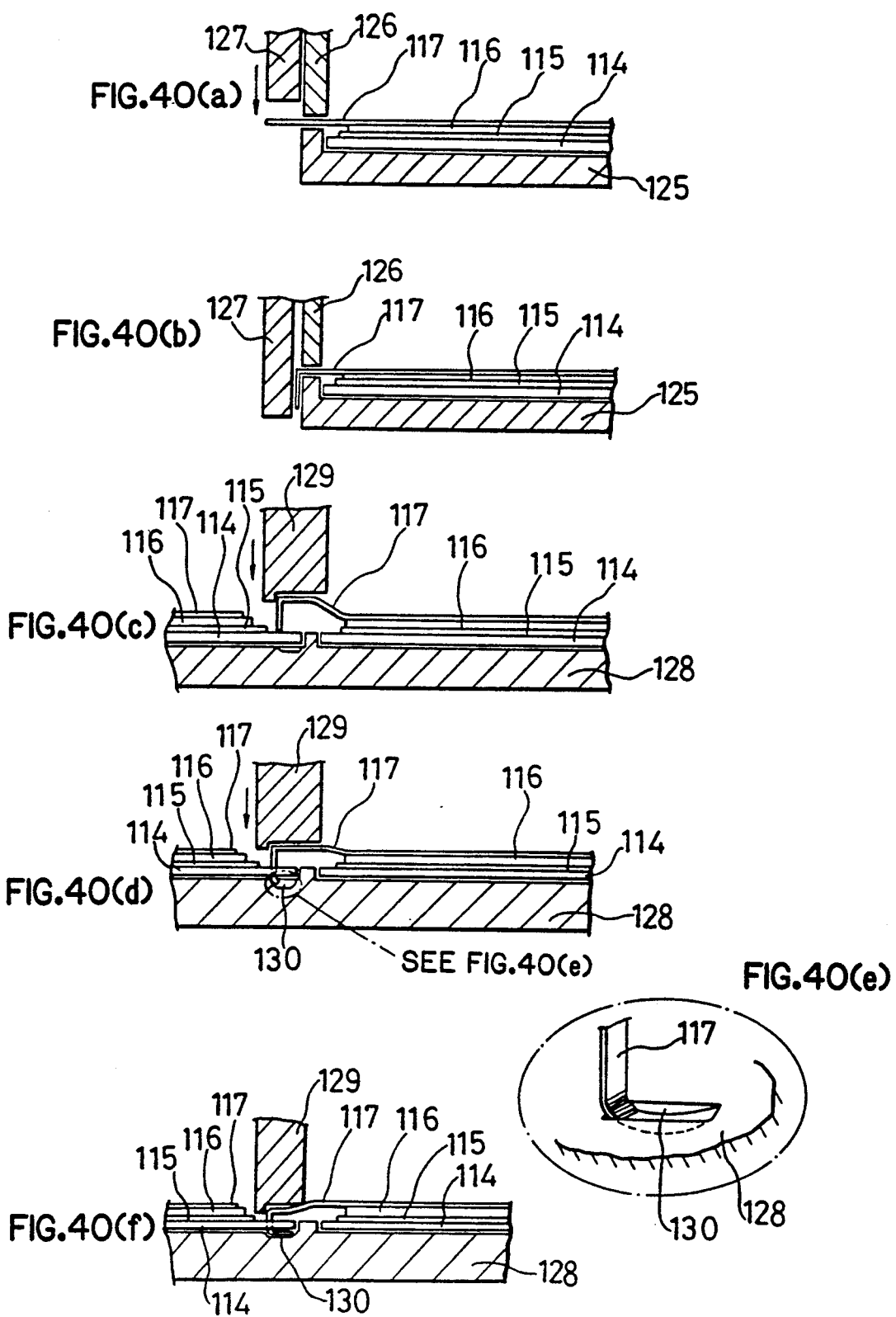
FIGS. 40(a) to 40(f) are cross-sectional views showing a method for connecting two cells with each other in the thin film solar cell array shown in FIGS. 34(a)-34(c)

FIGS. 40(a) to 40(f) illustrate process steps for passing an end of the lead wire 117 through the conductive substrate 114 in a method for producing the thin film solar cell shown in FIG. 34 in which FIGS. 40(a) to 40(d) and 40(f) are cross-sectional views and FIG. 40(e) is an enlarged view of a portion of FIG. 40(d). In these figures, the same reference numerals as in FIG. 34 designate the same or corresponding parts. First, a cell is placed on a base plate 125 so that an end of a lead wire 117 soldered onto an upper electrode of the cell protrudes from the end of the base plate 125 by a prescribed length. Then, the lead wire 117 is fixed by a metal fitting 126. Then, as shown in FIG. 40(a), a piston 127 is lowered to bend the end of the lead wire, as shown in FIG. 40(b). Then, this cell and a cell to be connected are placed on a base 128 and a jig 129 is placed on the lead wire, as shown in FIG. 40(c). When the jig 129 is lowered, the end of the lead wire penetrates through the substrate 114, as shown in FIG. 40(d). At this time, as shown in FIG. 40(e), a lead wire guide groove 130 is formed on the surface of the base 128, whereby the end of the lead wire penetrating through the substrate is bent along the guide groove 130, as shown in FIG. 40(f). In this way, the two cells are connected to each other.

Figure 41:
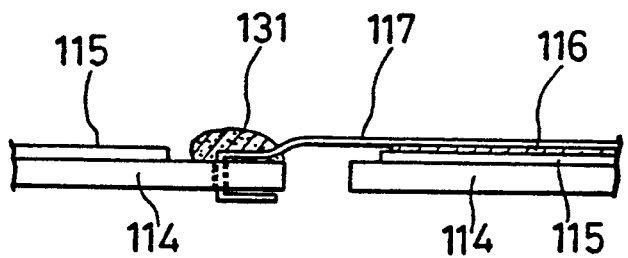
FIG. 41 is a diagram showing a variation of the thin film solar cell array shown in FIGS. 34(a)-34(c)

In order to reduce contact resistance at the connecting part of the substrate 114 and the lead wire 117, a conductive paste 131 may be applied to the connecting part, as shown in FIG. 41. Thereby, the contact resistance is reduced and the connecting strength is increased.

Figure 42A:
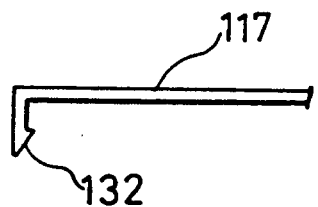
FIGS. 42(a) and 42(b) are diagrams showing another variation of the thin film solar cell array shown in FIGS. 34(a)-34(c)
Figure 42B:
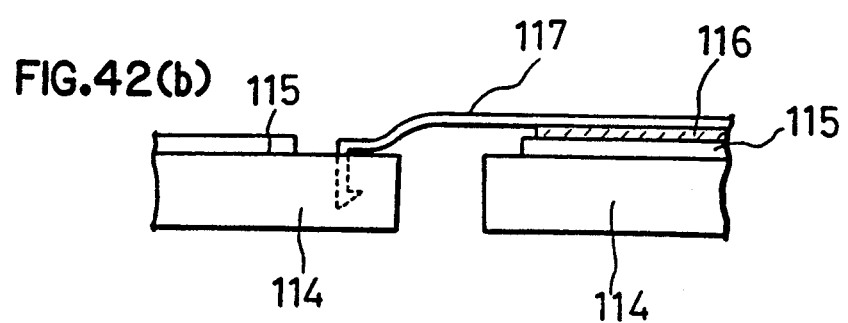
Figure 43:
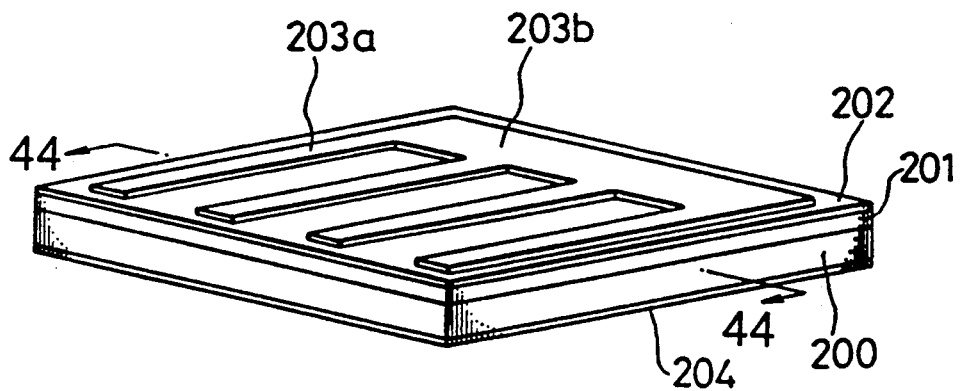
FIG. 43 is a perspective view showing a prior art thin film solar cell.
Figure 44:
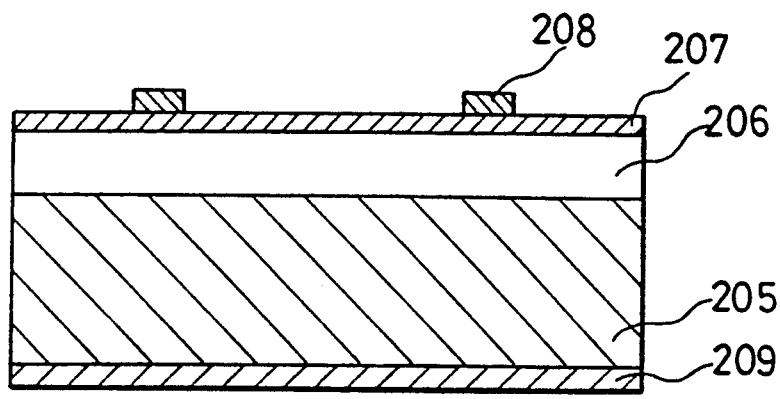
FIG. 44 is a cross-sectional view taken along line 44—44 of FIG. 43 showing a prior art thin film solar cell using a graphite substrate.
Figure 45:
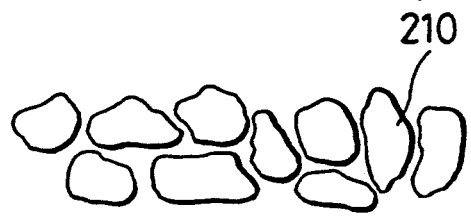
FIG. 45 is a diagram showing a surface structure of a graphite substrate.
Figure 46:
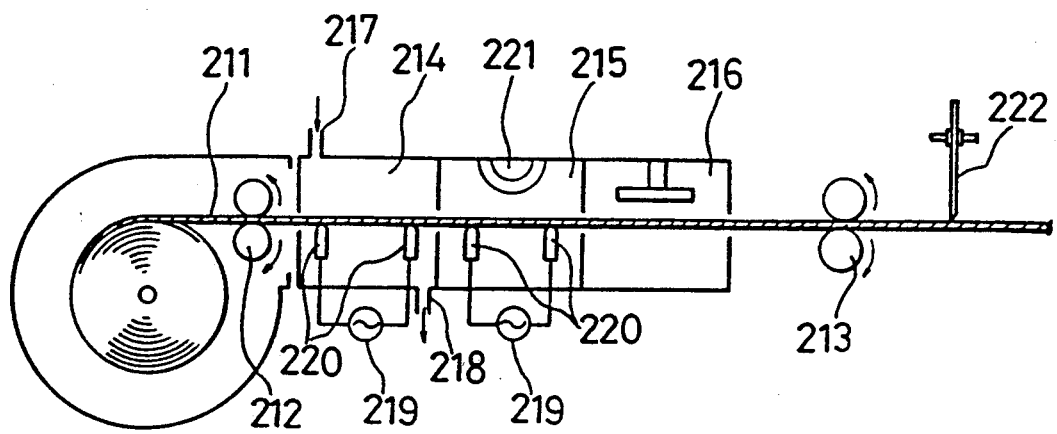
FIG. 46 is a schematic diagram showing a method for producing a prior art thin film solar cell using a graphite sheet as a substrate.
Figure 47:
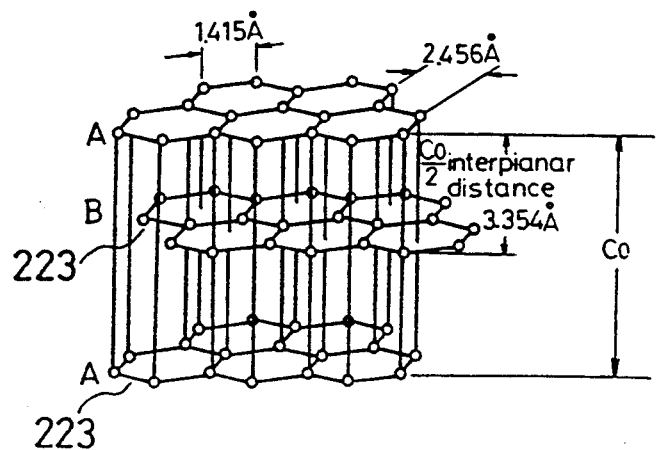
FIG. 47 is a diagram showing the crystal structure of graphite.
Figure 48:
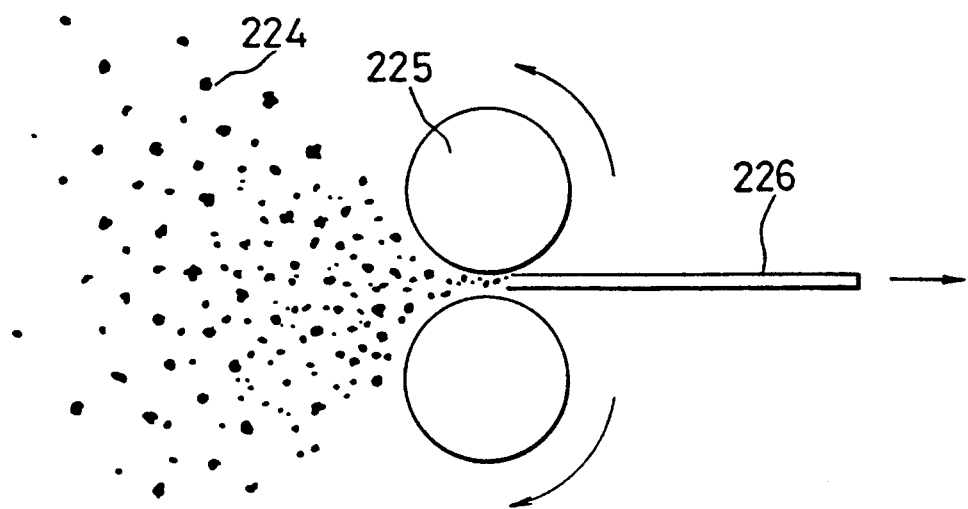
FIG. 48 is a schematic diagram showing a method for producing a graphite sheet.
Figure 49:
FIG. 49 is a diagram showing the surface structure of a graphite sheet.
Figure 50:
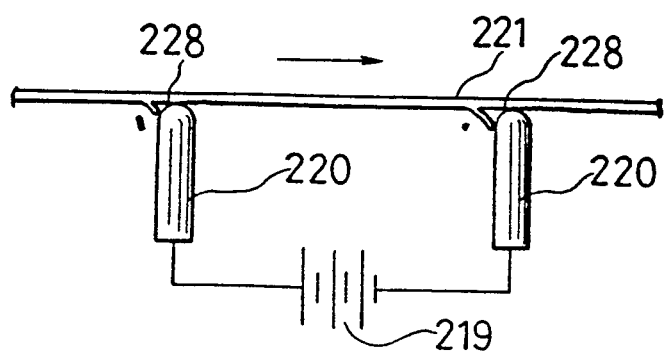
FIG. 50 is a diagram for explaining a problem in the production method of FIG. 46.
Figure 51:
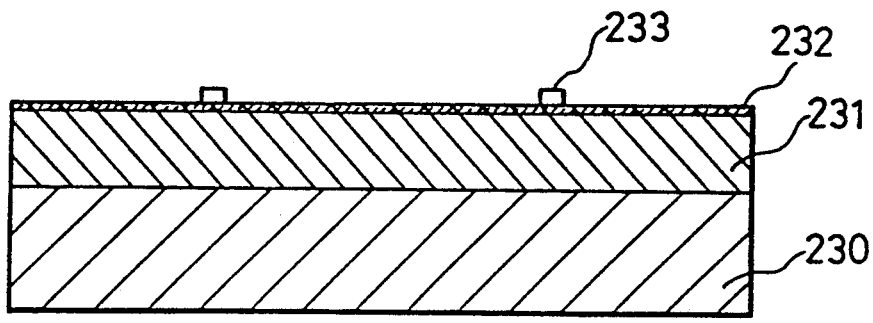
FIG. 51 is a cross-sectional view showing a prior art thin film solar cell using a substrate comprising mainly carbon.
Figure 52:
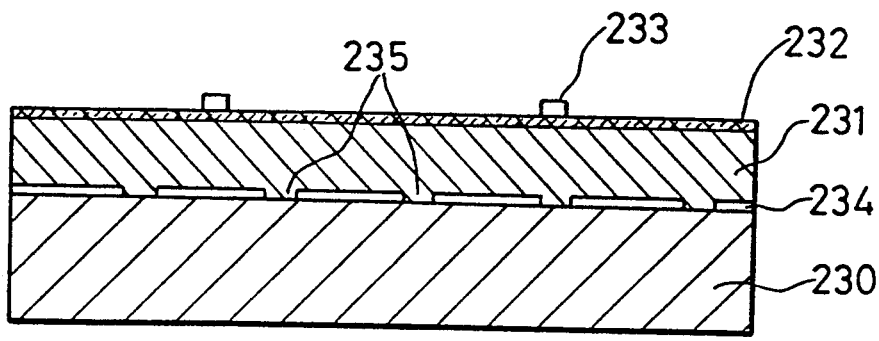
FIG. 52 is a cross-sectional view showing another prior art thin film solar cell using a substrate comprising mainly carbon.

While, in the above-described embodiment, the lead wire penetrates through the substrate for connection, the end of the lead wire may remain in the substrate, as shown in FIG. 42(b). In this case, if the end 132 of the lead wire 117 is shaped like a hook, as shown in FIG. 42(a), the connecting strength is increased.

As described above, according to the twelfth embodiment of the present invention, a conductive material having a lower hardness than the lead wire, such as a graphite sheet, is used as the substrate of the thin film solar cell and the end portion of the lead wire soldered onto the upper electrode of the solar cell is pressed against the substrate of the adjacent solar cell whereby the lead wire penetrates through the substrate or enters into the substrate, that is, the lead wire is fixed in the substrate. In this way, the two cells are connected to each other with a high mechanical strength.

What is claimed is:

1. A method for producing a thin-film semiconductor solar cell, comprising:
    forming an anisotropic substrate comprising a graphite sheet made from flaky graphite by passing graphite between rollers and hardening the sheet at a temperature exceeding 1,000° C.; and
    depositing a thin semiconductor active layer on said substrate while heating said substrate by induction with a high frequency electrical signal.

2. A method for producing a thin-film semiconductor solar cell, comprising:
    forming an anisotropic substrate comprising a graphite sheet made from flaky graphite by passing graphite between rollers and annealing the sheet at a temperature of at least 3,000° C. in an HCl ambient; and
    depositing a thin semiconductor active layer on said substrate while heating said substrate by induction with a high frequency electrical signal.

3. A method for producing a thin-film semiconductor solar cell, comprising:
    forming an anisotropic substrate comprising a graphite sheet made from flaky graphite by passing graphite between rollers and fixing the graphite sheet so formed to a frame made of one of carbon and ceramic to tension the graphite sheet; and depositing a thin semiconductor active layer on said substrate while heating said substrate by induction with a high frequency electrical signal.

4. The method according to claim 3 including, after depositing the thin-film active layer, adhering a metal plate to the graphite sheet with a metal paste.

5. A method for producing a thin-film semiconductor solar cell, comprising:

plasma spraying a metallurgical grade silicon layer on a surface of a graphite sheet opposite a surface of the graphite sheet on which a thin semiconductor active layer is to be formed; and depositing a thin semiconductor active layer on the side of said graphite sheet opposite the metallurgical grade silicon while heating said graphite sheet by induction with a high frequency electrical signal.

6. A method for producing a thin-film semiconductor solar cell, comprising:

placing a graphite sheet made from flaky graphite in a mold having a hollow so that the sheet conforms to the shape of the hollow, placing metallurgical grade silicon powder on the graphite sheet in the hollow, heating the mold to melt the metallurgical grade silicon powder, and cooling the mold to solidify the metallurgical grade silicon powder, thereby producing a heat-resistant substrate including a metallurgical grade silicon layer adhered to a surface of a graphite sheet; and depositing a thin semiconductor active layer on the surface of the graphite sheet opposite the metallurgical grade silicon layer while heating the graphite sheet by induction with a high frequency electrical signal.

7. A method for producing a thin-film semiconductor solar cell, comprising:

forming a graphite sheet made from flaky graphite by purifying and foaming graphite in an acid, and forming concavo-convex surfaces on the graphite sheet by pressing the purified graphite between rollers having concavo-convex surfaces; and depositing a thin semiconductor active layer on the graphite sheet while heating the graphite sheet by induction with a high frequency electrical signal.

8. A method for producing a thin-film semiconductor solar cell, comprising:

forming a graphite sheet made from flaky graphite having a concavo-convex surface by pressing a flat graphite sheet made of flaky graphite between rollers having concavo-convex surfaces; and depositing a thin semiconductor active layer on the graphite sheet while heating the graphite sheet by induction with a high frequency electrical signal.

* * * * *